(12) United States Patent
Kusunoki et al.

(10) Patent No.: US 12,243,345 B2
(45) Date of Patent: Mar. 4, 2025

(54) ELECTRONIC DEVICE

(71) Applicant: Semiconductor Energy Laboratory Co., Ltd., Atsugi (JP)

(72) Inventors: Koji Kusunoki, Isehara (JP); Daisuke Kubota, Atsugi (JP); Ryo Hatsumi, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/370,907

(22) Filed: Sep. 21, 2023

(65) Prior Publication Data

US 2024/0127622 A1 Apr. 18, 2024

Related U.S. Application Data

(63) Continuation of application No. 17/640,543, filed as application No. PCT/IB2020/058440 on Sep. 11, 2020, now Pat. No. 11,804,064.

(30) Foreign Application Priority Data

Sep. 27, 2019 (JP) .................................. 2019-177302

(51) Int. Cl.
*G06V 40/13* (2022.01)
*G06F 3/041* (2006.01)
(Continued)

(52) U.S. Cl.
CPC ........ *G06V 40/1318* (2022.01); *G06F 3/0412* (2013.01); *G06F 3/042* (2013.01);
(Continued)

(58) Field of Classification Search
None
See application file for complete search history.

(56) References Cited

U.S. PATENT DOCUMENTS 10,115,777 B2 10/2018 Tanaka et al.
10,984,208 B2 4/2021 Zhu et al.
(Continued)

FOREIGN PATENT DOCUMENTS

CN 103135924 A 6/2013
CN 104915051 A 9/2015
(Continued)

OTHER PUBLICATIONS

International Search Report (Application No. PCT/IB2020/058440) Dated Dec. 15, 2020.
(Continued)

*Primary Examiner* — Nicholas J Lee
(74) *Attorney, Agent, or Firm* — Eric J. Robinson; Robinson Intellectual Property Law Office, P.C.

(57) ABSTRACT

An electronic device capable of detecting a difference in the way of touch is provided. An electronic device capable of detecting a difference in the way of touch with a small number of components is provided. An electronic device capable of executing various types of processes with simple operation is provided. The electronic device includes a control portion and a display portion. The display portion has a function of displaying an image on a screen and includes a detection portion. The detection portion has a function of detecting a touch operation and a function of imaging, at least twice, a detection object touching the screen. The control portion has a function of calculating a difference between the area of the detection object in first imaging and the area of the detection object in second imaging to execute a different process depending on whether the difference is larger or smaller than a reference.

3 Claims, 19 Drawing Sheets

(51) Int. Cl.
*G06F 3/042* (2006.01)
*G06V 40/12* (2022.01)
*G06V 40/50* (2022.01)
*H10K 65/00* (2023.01)

(52) U.S. Cl.
CPC .......... *G06V 40/1365* (2022.01); *G06V 40/50* (2022.01); *H10K 65/00* (2023.02)

(56) References Cited

U.S. PATENT DOCUMENTS

| | | |
|---|---|---|
| 2013/0176283 A1 | 7/2013 | Nakata |
| 2014/0056493 A1 | 2/2014 | Gozzini |
| 2015/0261296 A1 | 9/2015 | Yoshikawa |
| 2015/0296062 A1* | 10/2015 | Lee ................ G02F 1/133528 |
| | | 455/566 |
| 2017/0330920 A1 | 11/2017 | Tanaka et al. |
| 2019/0340409 A1 | 11/2019 | Zhu et al. |
| 2020/0155941 A1 | 5/2020 | Ito |
| 2020/0302044 A1* | 9/2020 | Agassy .................. G06F 21/32 |
| 2021/0327979 A1 | 10/2021 | Kamada et al. |
| 2022/0253517 A1 | 8/2022 | Yamazaki et al. |

FOREIGN PATENT DOCUMENTS

| | | |
|---|---|---|
| CN | 109509767 A | 3/2019 |
| EP | 3503197 A | 6/2019 |
| JP | 2013-117890 A | 6/2013 |
| JP | 2013-247443 A | 12/2013 |
| JP | 2015-176371 A | 10/2015 |
| JP | 2017-208173 A | 11/2017 |
| JP | 2019-051297 A | 4/2019 |
| JP | 2020-533614 | 11/2020 |
| KR | 2019-0035609 A | 4/2019 |
| WO | WO-2019/052253 | 3/2019 |

OTHER PUBLICATIONS

Written Opinion (Application No. PCT/IB2020/058440) Dated Dec. 15, 2020.

* cited by examiner

FIG. 6A
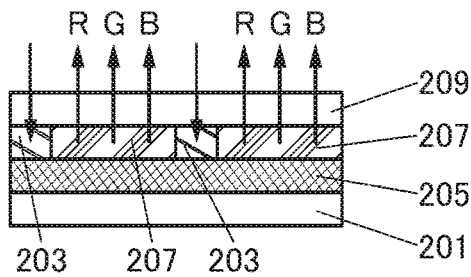
FIG. 6B
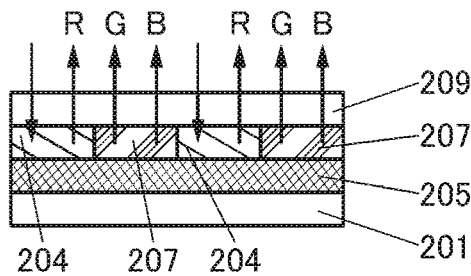
FIG. 6C
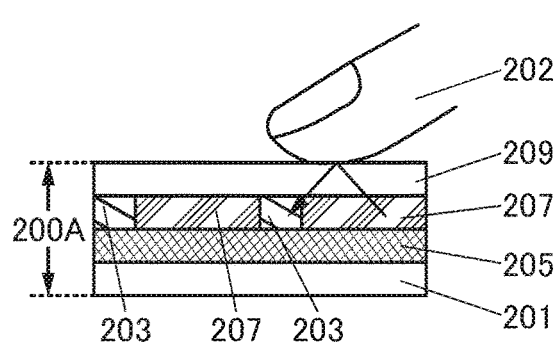
FIG. 6D
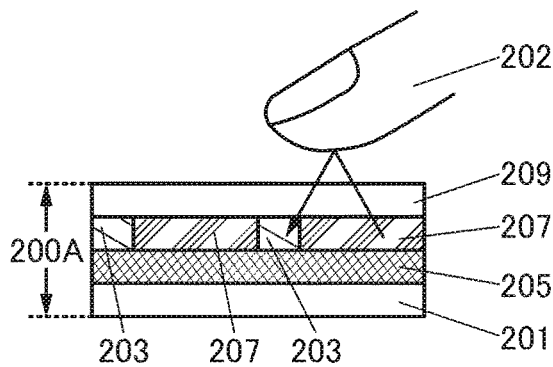
FIG. 6E
FIG. 6F
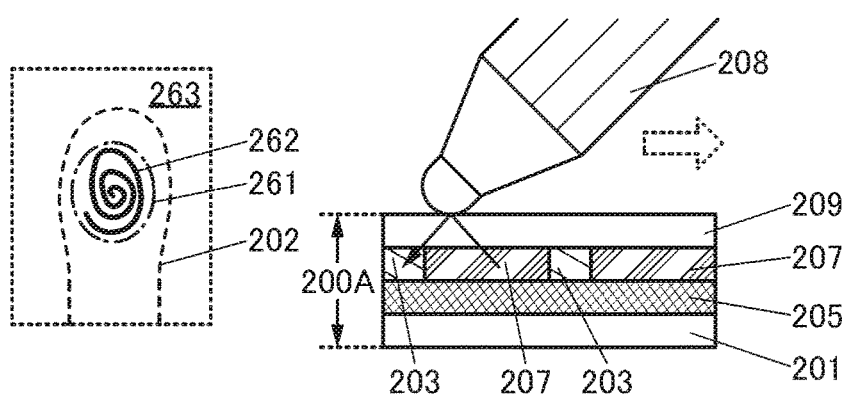
FIG. 6G
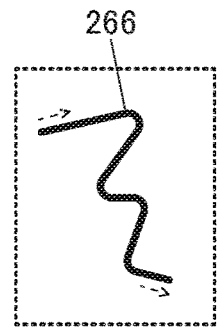
FIG. 6H
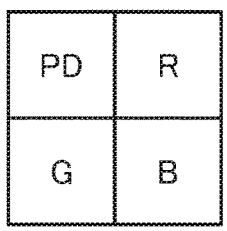
FIG. 6J
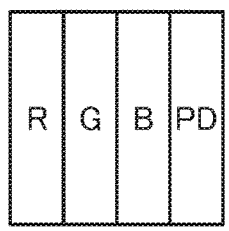
FIG. 6K
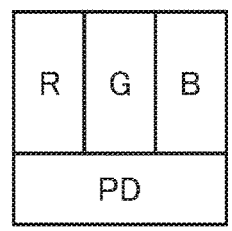
FIG. 6L
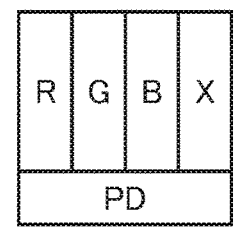

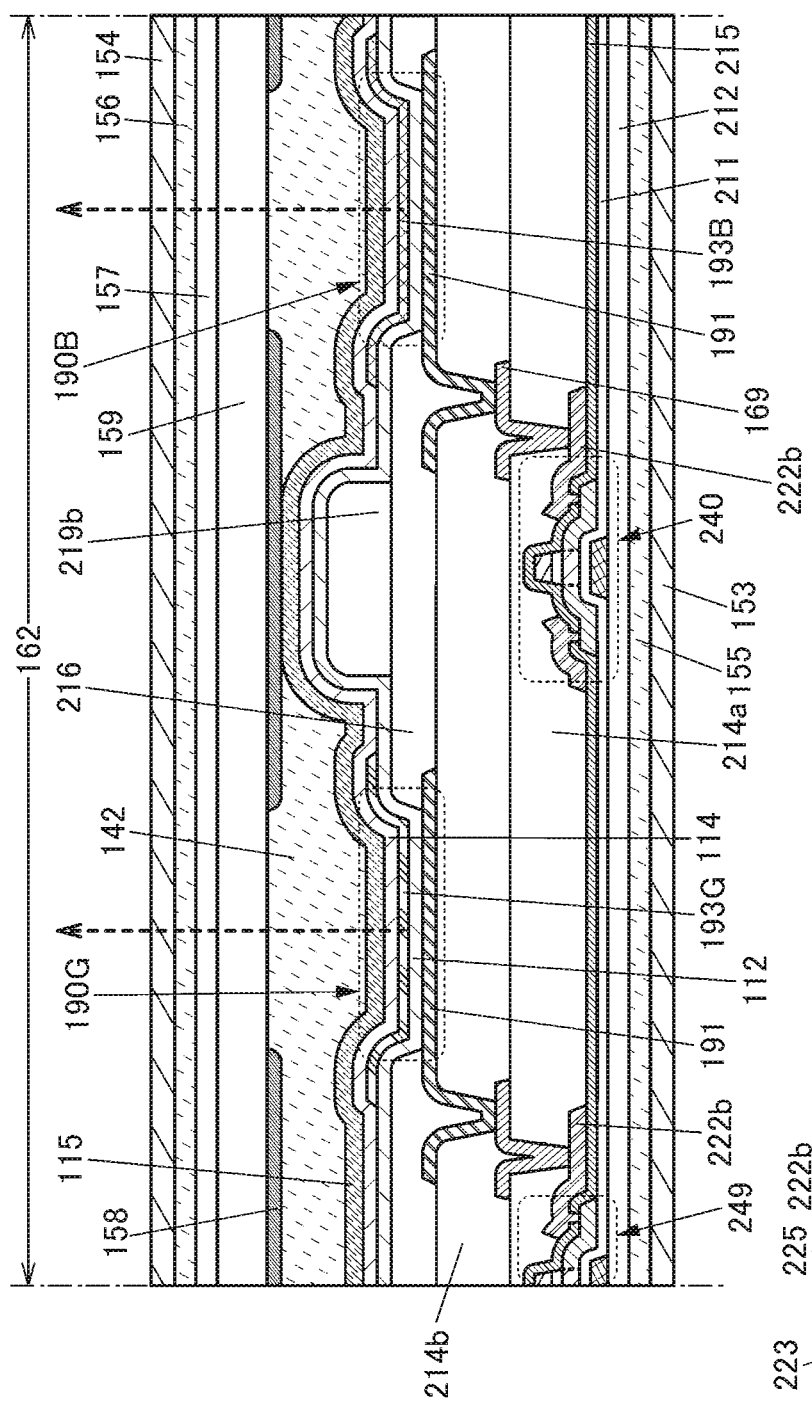
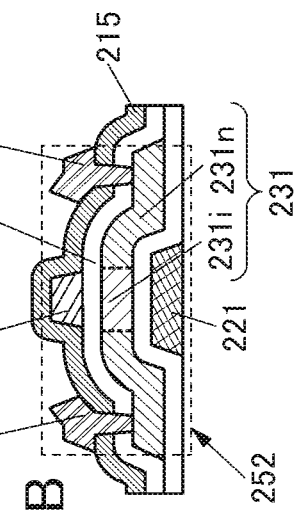
FIG. 15A
FIG. 15B

ELECTRONIC DEVICE

TECHNICAL FIELD

One embodiment of the present invention relates to an electronic device. One embodiment of the present invention relates to a display device. One embodiment of the present invention relates to a program.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, most of information terminal devices, for example, mobile phones such as smartphones and tablet information terminals, are provided with a function of executing various types of processes with simple operation. An example of the function is, for greater variation in operations, to detect the intensity of a touch (a pressure) and change the process to be executed depending on the degree of the pressure.

Such information terminal devices often include personal information or the like, and thus various authentication technologies for preventing abuse have been developed.

For example, Patent Document 1 discloses an electronic device including a fingerprint sensor in a push button switch portion.

REFERENCE

Patent Document

[Patent Document 1] United States Published Patent Application No. 2014/0056493

SUMMARY OF THE INVENTION

Problems to be Solved by the Invention

Capacitive touch sensors widely used for information terminal devices sense contact by utilizing a change in the capacitance of the display surface. A capacitive touch sensor cannot detect any pressure applied to the display, although being capable of determining the position of a finger, a capacitive touch pen, or the like. For this reason, a pressure-sensitive sensor capable of sensing a push is often employed for detecting a difference in the way of touch. However, including a pressure-sensitive sensor increases the number of components of an information terminal device.

An object of one embodiment of the present invention is to provide an electronic device capable of detecting a difference in the way of touch. Another object of one embodiment of the present invention is to provide an electronic device capable of detecting a difference in the way of touch with a small number of components. Another object of one embodiment of the present invention is to provide an electronic device capable of executing various types of processes with simple operation. Another object of one embodiment of the present invention is to provide a novel electronic device.

Note that the description of these objects does not preclude the existence of other objects. One embodiment of the present invention does not need to achieve all the objects. Other objects can be derived from the description of the specification, the drawings, and the claims.

Means for Solving the Problems

One embodiment of the present invention is an electronic device including a control portion and a display portion. The display portion has a function of displaying an image on a screen and includes a detection portion. The detection portion has a function of detecting a touch operation and a function of imaging, at least twice, a detection object touching the screen. The control portion has a function of calculating a difference between the area of the detection object in first imaging and the area of the detection object in second imaging to execute a different process depending on whether the difference is larger or smaller than a reference.

Another embodiment of the present invention is an electronic device including a control portion, a display portion, and a memory portion. The display portion has a function of displaying an image on a screen and includes a detection portion. The detection portion has a function of detecting a touch operation and a function of imaging a detection object touching the screen. The control portion has a function of obtaining information on a contact area of the detection object, from data on imaging by the detection portion. The memory portion has a function of retaining information on a reference contact area registered in advance. The control portion has a function of executing a different process depending on whether the contact area of the detection object is larger or smaller than the reference contact area.

Another embodiment of the present invention is an electronic device including a control portion, a display portion, and a memory portion. The display portion has a function of displaying an image on a screen and includes a detection portion. The detection portion has a function of detecting a touch operation on the screen and a function of imaging a finger touching the screen. The control portion has a function of obtaining information on a contact area of the finger and fingerprint information on the finger, from data on imaging by the detection portion. The memory portion has a function of retaining fingerprint information for collation registered in advance and information on a reference contact area registered in advance. The control portion has a function of collating the fingerprint information on the finger with the fingerprint information for collation and a function of, when the fingerprint information on the finger matches the fingerprint information for collation, executing a different process depending on whether the contact area of the finger is larger or smaller than the reference contact area.

In the above, the display portion preferably includes a plurality of pixels and has a function of imaging using a whole display region. In that case, it is preferable that the pixel include a light-emitting element and a light-receiving element, and the light-emitting element and the light-receiving element be provided on the same plane.

In the above, the light-emitting element preferably has a stacked-layer structure in which a first electrode, a light-emitting layer, and a common electrode are stacked. The light-receiving element preferably has a stacked-layer structure in which a second electrode, an active layer, and the common electrode are stacked. In that case, the light-emitting layer and the active layer preferably contain different organic compounds from each other. Furthermore, it is preferable that the first electrode and the second electrode be provided on the same plane to be apart from each other and the common electrode be provided to cover the light-emitting layer and the active layer.

Alternatively, in the above, the light-emitting element preferably has a stacked-layer structure in which a first electrode, a common layer, a light-emitting layer, and a common electrode are stacked. The light-receiving element preferably has a stacked-layer structure in which a second electrode, the common layer, an active layer, and the common electrode are stacked. In that case, the light-emitting layer and the active layer preferably contain different organic compounds from each other. Furthermore, it is preferable that the first electrode and the second electrode be provided on the same plane to be apart from each other, the common electrode be provided to cover the light-emitting layer and the active layer, and the common layer be provided to cover the first electrode and the second electrode.

In the above, it is preferable that the light-emitting element have a function of emitting visible light, and the light-receiving element have a function of receiving the visible light emitted by the light-emitting element.

Alternatively, in the above, it is preferable that the light-emitting element have a function of emitting infrared light, and the light-receiving element have a function of receiving the infrared light emitted by the light-emitting element.

Effect of the Invention

According to one embodiment of the present invention, an electronic device capable of detecting a difference in the way of touch can be provided. According to one embodiment of the present invention an electronic device capable of detecting a difference in the way of touch with a small number of components can be provided. According to one embodiment of the present invention, an electronic device capable of executing various types of processes with simple operation can be provided. According to one embodiment of the present invention, a novel electronic device can be provided.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 6A to FIG. 6D and FIG. 6F are cross-sectional views illustrating examples of a display device.

FIG. 6E and FIG. 6G are diagrams illustrating examples of an image captured by the display device.

FIG. 6H and FIG. 6J to FIG. 6L are top views illustrating examples of a pixel.

FIG. 11B and FIG. 1C are diagrams illustrating examples of a top surface layout of a resin layer.

FIG. 15A is a cross-sectional view illustrating an example of a display device. FIG. 15B is a cross-sectional view illustrating an example of a transistor.

MODE FOR CARRYING OUT THE INVENTION

Figure 1:
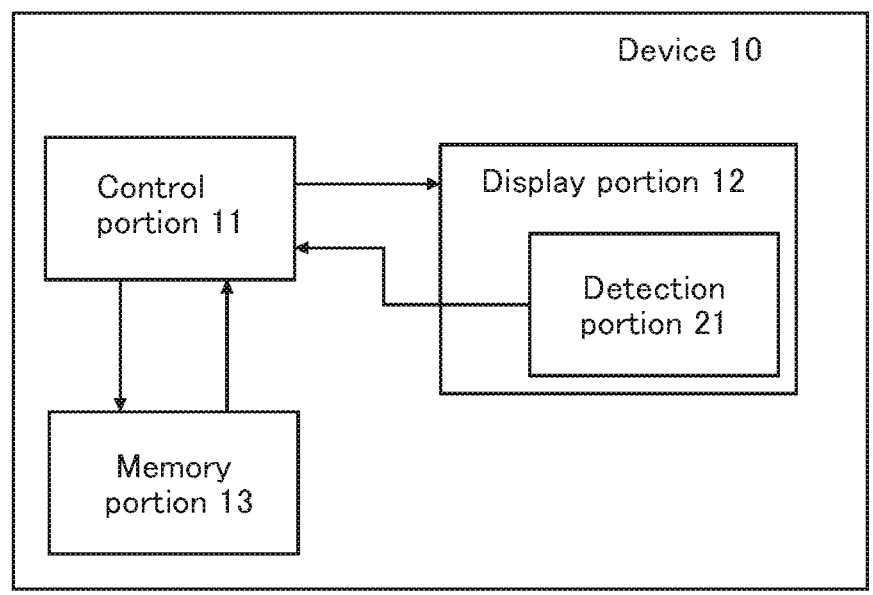
FIG. 1 is a diagram showing a structure example of a device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, an electronic device of one embodiment of the present invention is described with reference to FIG. 1 to FIG. 5.

Note that in the drawings attached to this specification, the block diagram in which components are classified according to their functions and shown as independent blocks is illustrated; however, it is difficult to separate actual components completely according to their functions, and one component may be related to a plurality of functions or a plurality of components may achieve one function.

The electronic device of one embodiment of the present invention is capable of recognizing a difference in the way of touch by detecting the contact area of the detection object. Thus, the electronic device enables different processes to be executed depending on the way of touch. The electronic device of one embodiment of the present invention is preferably operated with an object with variations in contact area, such as a finger or a rubber-tipped pen, in particular.

In the electronic device of one embodiment of the present invention, specifically, the detection object that touches a screen is imaged and then information on the contact area is obtained, which enables different processes to be executed depending on whether the contact area of the detection object is larger or smaller than the reference contact area registered in advance. Thus, executed processes can differ depending on, for example, whether the screen is pressed firmly or lightly.

In the electronic device of one embodiment of the present invention, the detection object that touches a screen is imaged and then information on the contact area is obtained, whereby processes in response to variations in the contact area of the detection object can be executed. For example, the detection object is imaged twice, a difference in the contact area of the detection object between the first time and the second time is calculated, and then a different process can be executed depending on whether the contact area is larger or smaller than the reference. Thus, for example, when the screen is pressed long, a different process can be executed depending on whether the screen continues to be touched with the same pressure or the screen is pressed with increasing pressure after being touched.

Detection of a touch operation and imaging of a detection object can be performed in a display portion of the electronic device of one embodiment of the present invention. Then, information on the contact area of the detection object can be obtained from data on the imaging of the detection object, whereby a difference in the way of touch can be recognized. Thus, a multifunctional device can be achieved by a small number of components because there is no need to mount a pressure-sensitive sensor or the like on the device separately.

The electronic device of one embodiment of the present invention may have a function of obtaining the fingerprint of a finger touching the screen and executing user authentication processing with the use of the fingerprint. When fingerprint information is combined with the contact area of the finger, a device with an extremely high security level can be achieved. For example, settings can be made so that, with fingerprint information and the size or changing pattern of the contact area stored in the device, no further processes can be executed unless both a matching piece of fingerprint information and a matching size or changing pattern of the contact area are confirmed. The device may also have a function of executing user authentication processing with the use of a palm print as well as a fingerprint.

As described above, imaging of a detection object can be performed in the display portion of the electronic device of one embodiment of the present invention. Thus, the fingerprint information on the detection object can be obtained from the data on the imaging of the finger touching the screen. Thus, a multifunctional device can be achieved by a small number of components because there is no need to mount a fingerprint sensor or the like on the device separately.

[Structure Example of Electronic Device]

FIG. 1 illustrates a block diagram of a device 10 of one embodiment of the present invention. The device 10 includes a control portion 11, a display portion 12, and a memory portion 13. The display portion 12 includes a detection portion 21. The device 10 can be used as an electronic device such as an information terminal device, for example.

The display portion 12 has a function of displaying an image, a function of detecting a touch operation, and a function of imaging a detection object. Furthermore, the display portion 12 preferably has a function of obtaining fingerprint information on a finger touching a screen or the like. Here, an example where the display portion 12 includes the detection portion 21 is illustrated. The detection portion 21 is a portion having, out of the above functions of the display portion 12, the function of detecting a touch operation, a function of imaging a detection object, and the function of obtaining fingerprint information. The display portion 12 can also be referred to as a touch panel with a fingerprint information obtaining function. For example, a display device described in detail in Embodiment 2 can be used for the display portion 12.

The detection portion 21 has a function of outputting information on the position touched by a detection object on a screen to the control portion 11. Furthermore, the detection portion 21 has a function of imaging a detection object touching the screen and outputting the image information as fingerprint information to the control portion 11.

The display portion 12 is preferably capable of imaging the detection object that touches any position on the screen. In other words, on the screen, an area where the touch sensor functions preferably matches or substantially matches an area where the information on the contact area of the detection object (further, fingerprint information) can be obtained.

Although FIG. 1 shows an example in which the display portion 12 includes the detection portion 21, they may be provided separately. Alternatively, a detection portion used to detect a touch operation and a detection portion used to obtain fingerprint information may be separately provided. For example, a detection portion obtaining fingerprint information may be included in the display portion and a detection portion detecting a touch operation may be provided independently of the display portion. For example, a display device described in detail in Embodiment 2 may be used in the display portion including a detection portion obtaining fingerprint information, and a capacitive touch sensor may be used in the detection portion detecting a touch operation.

The memory portion 13 has a function of retaining information on the reference contact area. Furthermore, the memory portion 13 preferably has a function of retaining information on a user's fingerprint registered in advance. The memory portion 13 can output the information on the contact area (and further, fingerprint information) to the control portion 11 in response to the request from the control portion 11.

Information on the contact area may be registered in the device 10 in advance and may be registered as appropriate by the user. As the information on the reference contact area, a reference size of the contact area, a reference change in contact area, and the like can be given. For example, the control portion 11 can determine the process to be executed by judging whether the contact area of the detection object is larger than the reference size of the contact area or not. Alternatively, the control portion 11 can determine the process to be executed by judging whether a change in the contact area of the detection object is larger than the reference change in contact area or not.

The memory portion 13 preferably retains fingerprint information on all the fingers of a user used in operating the screen. For example, two pieces of fingerprint information on user's right and left index fingers can be retained. In addition to them, one or more pieces of fingerprint information on a middle finger, a ring finger, a little finger, and a thumb are preferably retained.

The control portion 11 has a function of requesting the detection portion 21 to image the detection object when the detection portion 21 detects a touch operation. The control portion 11 also has a function of obtaining information on the contact area of the detection object from data on the imaging of the detection object input from the detection portion 21. The control portion 11 has a function of collating the information on the contact area of the detection object with the information on the reference contact area registered in the memory portion 13 in advance.

The control portion 11 may have a function of obtaining information on a change in the contact area of the detection object from at least two pieces of imaging data input from the detection portion 21. At this time, the control portion 11 preferably collates the information on a change in contact area with the reference change in contact area registered in the memory portion 13 in advance and then executes the process in accordance with the collation result.

In addition, the control portion 11 preferably has a function of obtaining fingerprint information from the data on the imaging of the detection object input from the detection portion 21. Furthermore, the control portion 11 preferably has a function of collating the fingerprint information on the detection object with the fingerprint information registered in the memory portion 13 in advance.

For example, the control portion 11 executes the process in accordance with the contact area collation result when judging that the fingerprint information on the detection object matches the registered fingerprint information. By contrast, the control portion 11 executes no processes when judging that the two pieces of fingerprint information do not match each other.

Examples of a fingerprint authentication method executed by the control portion 11 include a method using the degree of similarity between two images compared, e.g., a template matching method or a pattern matching method. Alternatively, fingerprint authentication processing may be executed by inference using machine learning. At this time, the fingerprint authentication processing is preferably executed by inference using a neural network, in particular.

The control portion 11 can function as, for example, a central processing unit (CPU). The control portion 11 interprets and executes instructions from various programs with the use of a processor to process various kinds of data and control programs. Programs that might be executed by the processor may be stored in a memory region of the processor or may be stored in the memory portion 13.

Operation Example 1 of Device 10

Figure 2:
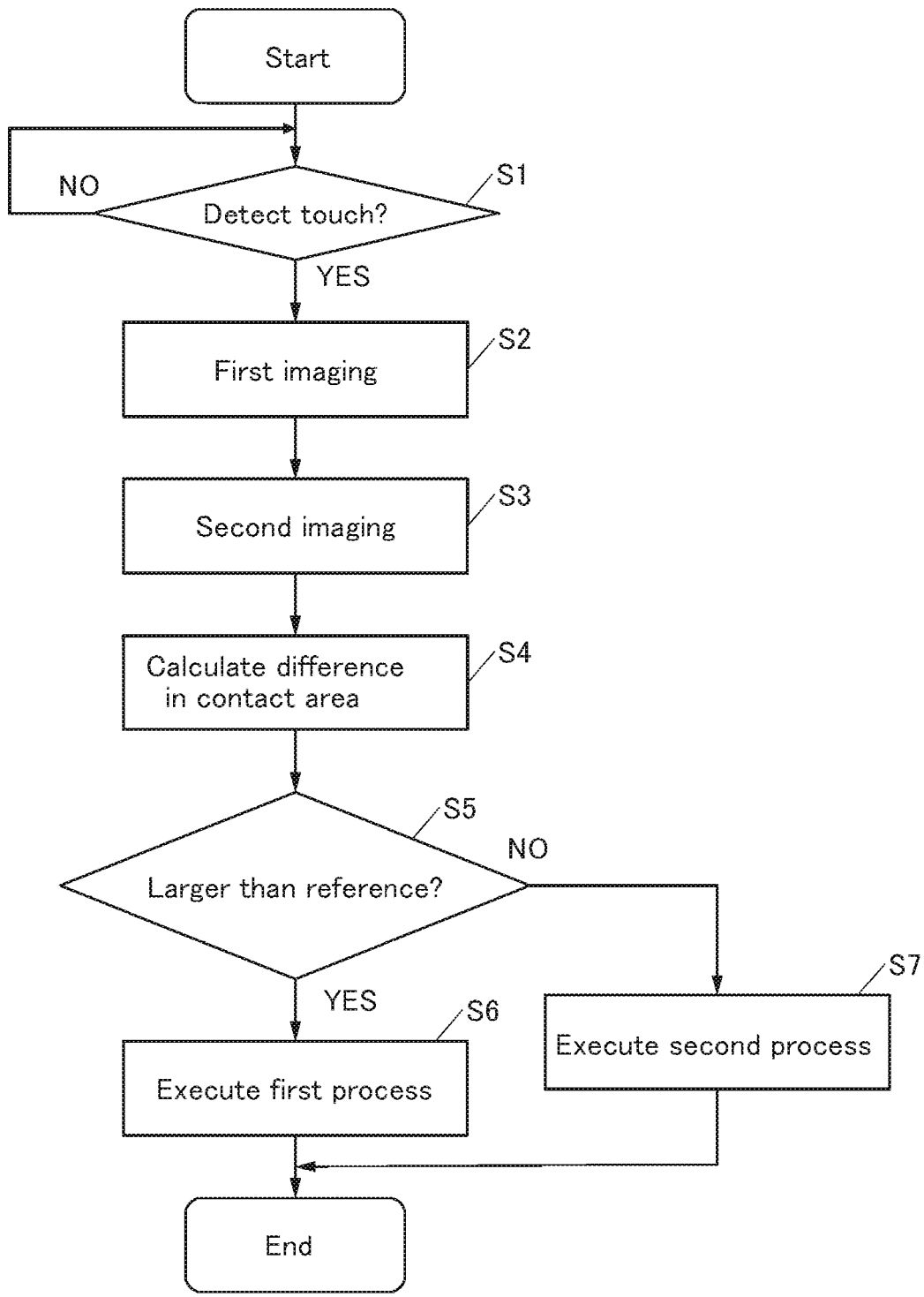
FIG. 2 is a diagram showing an operation method example of a device.

An operation example of the above device 10 is described below. In Operation Example 1, a difference in the way of touch can be recognized by detection of the contact area of the detection object. Thus, the electronic device enables a different process to be executed depending on the way of touch. Operation Example 1 is an example in which the detection object is imaged twice and then a different process is executed depending on whether a change in the contact area of the detection object is large or not. FIG. 2 is a flow chart of an operation of the device 10. The flow chart shown in FIG. 2 includes Step S1 to Step S7.

In Step S1, the detection portion 21 detects a touch operation. When a touch is detected, the operation proceeds to Step S2. When a touch operation is not performed, the system is on standby until a touch operation is performed (the operation proceeds to Step S1 again).

In Step S2, as first imaging, the detection object is imaged by the detection portion 21. The detection portion 21 outputs the obtained imaging data to the control portion 11.

In Step S3, as second imaging, the detection object is imaged by the detection portion 21 in a manner similar to that of the first imaging. The detection portion 21 outputs the obtained imaging data to the control portion 11.

In Step S4, the control portion 11 obtains information on the contact area of the detection object from the imaging data obtained by the detection portion 21. Then, the control portion 11 calculates a difference between the contact area of the detection object in the first imaging and the contact area of the detection object in the second imaging.

In Step S5, the control portion 11 judges whether the difference between the contact area of the detection object in the first imaging and the contact area of the detection object in the second imaging is larger than the reference or not. This embodiment shows an example in which the operation proceeds to Step S6 when the difference is larger than the reference, and the operation proceeds to Step S7 when the difference is smaller than or equal to the reference.

In Step S6, the control portion 11 executes a first process. For example, a predetermined application can be started.

In Step S7, the control portion 11 executes a second process. For example, a predetermined application can be started.

The above is the description of the flow chart shown in FIG. 2.

Note that the number of times of imaging may be one, in which case the process to be executed may be determined by judging whether the contact area of the detection object in the imaging is larger than the reference contact area registered in the memory portion 13 in advance or not. That is, Step S3 shown in FIG. 2 may be omitted. In this case, the detection object is imaged in Step S2, and the contact area of the detection object in the imaging is obtained in Step S4. Then, in Step S5, the process to be executed can be determined by judging whether the contact area of the detection object is larger than the reference contact area registered in the memory portion 13 in advance or not.

Operation Example 2 of Device 10

Figure 3:
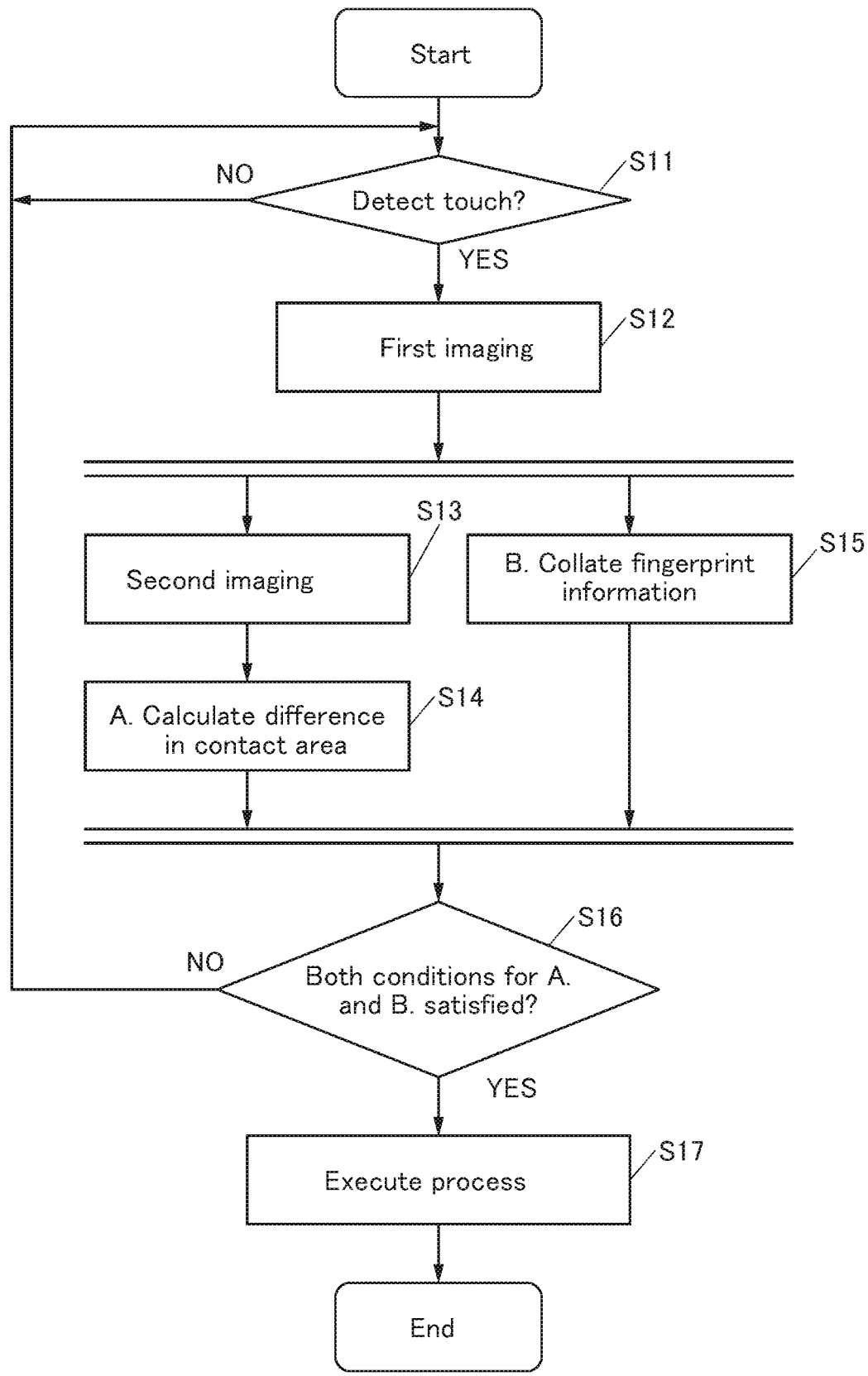
FIG. 3 is a diagram showing an operation method example of a device.

Another operation example of the above device 10 is described below. Operation Example 2 gives an example in which a predetermined process can be executed when a specific user applies increasing pressure after touching. Note that Operation Example 2 enables individual authentication in addition to the process in Operation Example 1 reflecting a difference in the way of touch, thereby further increasing the security level. FIG. 3 is a flow chart showing an operation of the device 10. The flow chart shown in FIG. 3 includes Step S11 to Step S17.

In Step S11, the detection portion 21 detects a touch operation. When a touch operation is detected, the operation proceeds to Step S12. When a touch operation is not performed, the system is on standby until a touch operation is performed (the operation proceeds to Step S11 again).

In Step S12, as first imaging, the detection object is imaged by the detection portion 21. The detection portion 21 outputs the obtained imaging data to the control portion 11.

In Step S13, as second imaging, the detection object is imaged by the detection portion 21 in a manner similar to that of the first imaging. The detection portion 21 outputs the obtained imaging data to the control portion 11.

Step S14 is the process A. In Step S14, the control portion 11 obtains information on the contact area of the detection object from the imaging data obtained by the detection portion 21. Then, the control portion 11 calculates a difference between the contact area of the detection object in the first imaging and the contact area of the detection object in the second imaging.

Step S15 is the process B. In Step S15, the control portion 11 obtains fingerprint information on the detection object from the imaging data obtained by the detection portion 21. This is followed by fingerprint information collation in the control portion 11. Specifically, the fingerprint information retained in the memory portion 13 and the fingerprint information obtained by the detection portion 21 are collated to judge whether these pieces of information match or not.

In Step S16, the control portion 11 judges whether the information obtained in the process from Step S12 to Step S15 matches both the fingerprint information retained in the memory portion 13 and the size of the contact area or the changing pattern of the size or not. In other words, the control portion 11 judges whether conditions for both the process A and the process B are satisfied or not. A condition for the process A may be that, for example, the difference in contact area of the detection object calculated in Step S14 is larger than the reference. A condition for the process B may be that the fingerprint information retained in the memory portion 13 which has been collated in Step S15 matches the fingerprint information obtained by the detection portion 21. When both the conditions for the process A and the process B are satisfied, the operation proceeds to Step S17. By contrast, when any one of the conditions is not satisfied, the operation proceeds to Step S11. In other words, when a different user touches, the predetermined process is not executed. Even when the touch operation is performed by the specific user, the predetermined process is not executed as long as the same pressure is applied while the touch operation is continued.

In Step S17, the control portion 11 executes the predetermined process. For example, a locked folder is unlocked to open the folder.

The above is the description of the flow chart shown in FIG. 3.

Figure 4A:
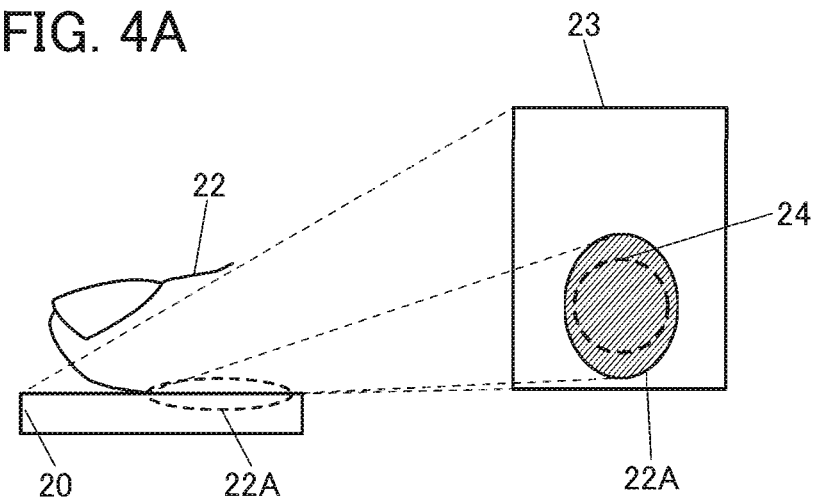
FIG. 4A and FIG. 4B are diagrams each illustrating a state where a finger is imaged and the imaging data.
Figure 4B:
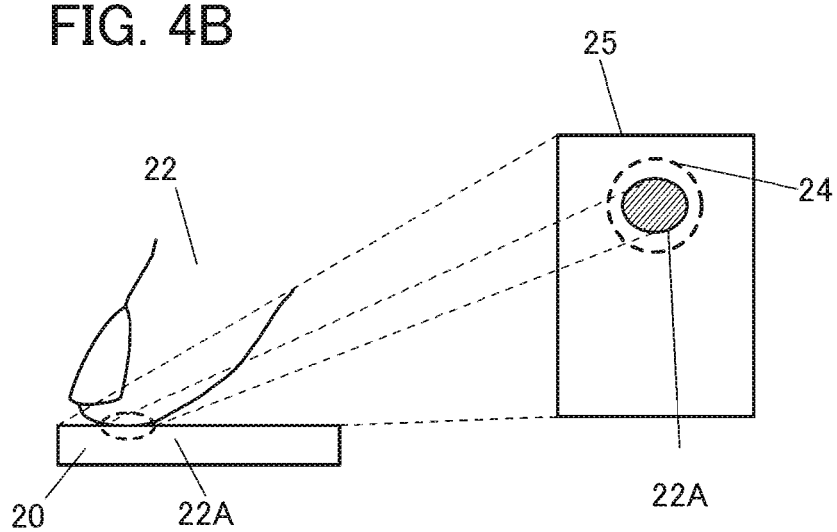

FIG. 4A and FIG. 4B each show a lateral view of the state where a finger is imaged and the imaging data.

FIG. 4A schematically illustrates a display portion 20, a finger 22, a captured image 23 of the finger, and a reference contact area 24 registered in advance. In FIG. 4A, the fingertip of the finger 22 touches a top surface of the display portion 20. At this time, the imaging by the display portion 20 results in the captured image 23 of the finger 22, a lower region of which includes a contact region 22A of the finger 22. Since the area of the contact region 22A (also referred to as contact area) of the finger 22 in the captured image 23 is larger than the reference contact area 24, the first process is executed.

FIG. 4B schematically illustrates the display portion 20, the finger 22, the captured image 25, and the reference contact area 24. In FIG. 4B, the fingertip of the finger 22 touches a top surface of the display portion 20. At this time, the imaging by the display portion 20 results in a captured image 25 of the finger 22, an upper region of which includes a contact region 22A of the finger 22. Since the area of the contact region 22A of the finger 22 in the captured image 25 is smaller than the reference contact area 24, the second process is executed.

As described above, the display portion is preferably capable of imaging the detection object that touches any position on the screen. Thus, in response to a touch on any position of the display portion, the contact area and the reference contact area can be compared so that the process can be executed.

A different process can be executed also depending on the center position of the contact region 22A of the finger 22 or on a shift in the center position thereof. Specifically, the screen may be enlarged when a shift in the center position of the contact region 22A of the finger 22 is larger than the reference; the screen may be reduced when a shift in the center position of the contact region 22A of the finger 22 is smaller than the reference.

FIG. 5 illustrates the contact area of the finger which changes over time.

Figure 5A:
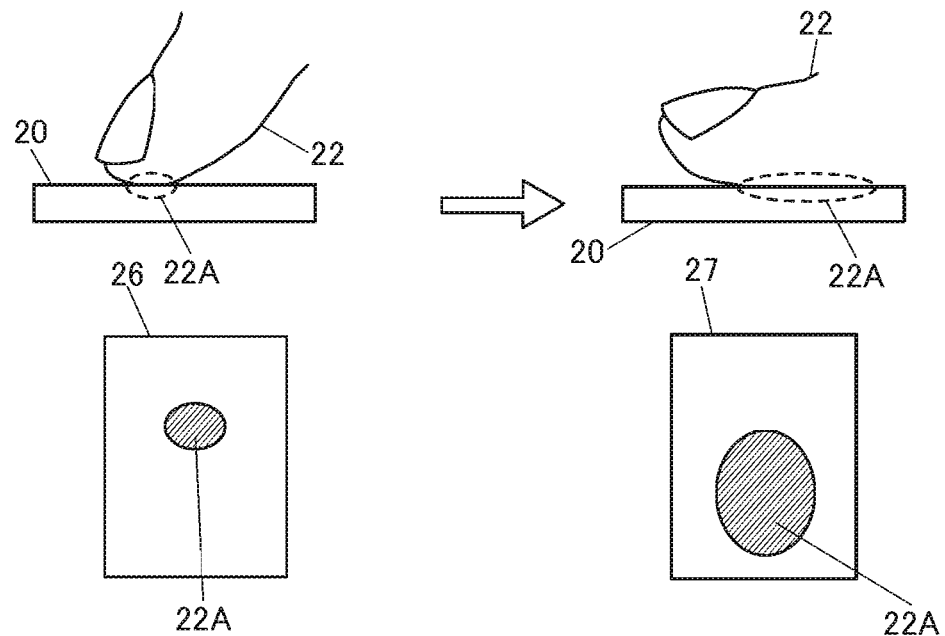
FIG. 5A and FIG. 5B are diagrams each illustrating a contact area of a finger which changes over time.

FIG. 5A schematically illustrates the display portion 20, the finger 22, a first captured image 26, and a second captured image 27. In FIG. 5A, the finger 22 touches the display portion 20, and the area of the contact region 22A increases over time. The difference in the area of the contact region 22A between the first captured image 26 and the second captured image 27 is calculated, and then, when the difference is larger than the reference change in contact area, the first process is executed. Note that the imaging frequency and the imaging interval can each be set as appropriate.

Figure 5B:
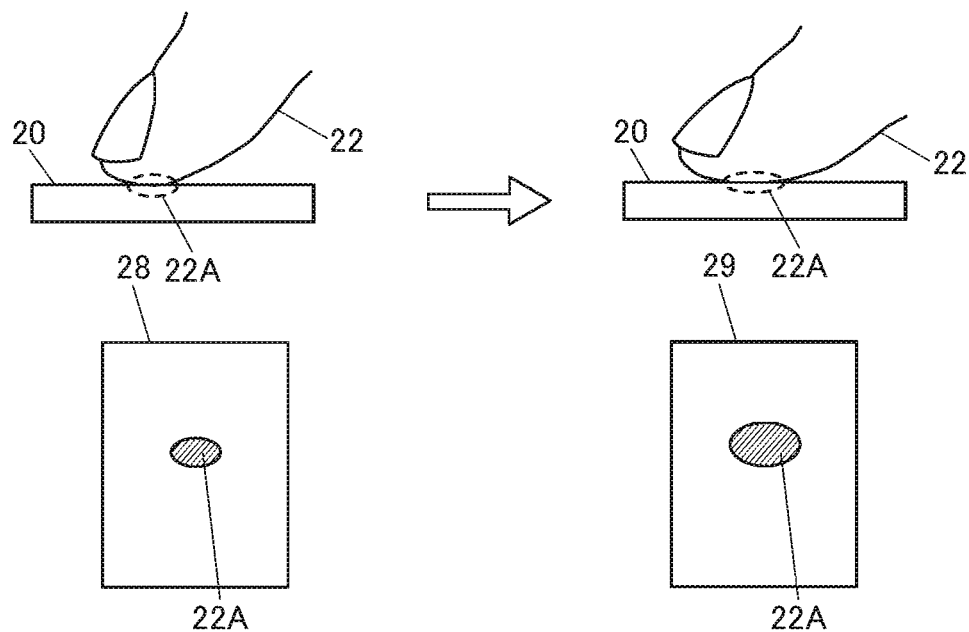

FIG. 5B schematically illustrates the display portion 20, the finger 22, a first captured image 28, and a second captured image 29. In FIG. 5B, the finger 22 touches the display portion 20, and a change in the area of the contact region 22A over time is smaller than the change in FIG. 5A. The difference in the area of the contact region between the first captured image 28 and the second captured image 29 is calculated, and then, when the difference is larger than the reference change in contact area, the second process is executed.

This embodiment can be combined with the other embodiments as appropriate. In this specification, in the case where a plurality of structure examples are shown in one embodiment, the structure examples can be combined as appropriate.

Embodiment 2

In this embodiment, display devices of one embodiment of the present invention are described with reference to FIG. 6 to FIG. 15.

The display device of this embodiment can be favorably used in the display portion of the device described in Embodiment 1.

The display portion of the display device of one embodiment of the present invention has a function of displaying an image with the use of a light-emitting element (also referred to as a light-emitting device). Furthermore, the display portion also has one or both of an image capturing function and a sensing function.

The display device of one embodiment of the present invention includes a light-receiving element (also referred to as a light-receiving device) and a light-emitting element. Alternatively, the display device of one embodiment of the present invention includes a light-emitting and light-receiving element (also referred to as a light-emitting and light-receiving device) and a light-emitting element.

First, the display device including a light-receiving element and a light-emitting element is described.

The display device of one embodiment of the present invention includes a light-receiving element and a light-emitting element in a display portion. In the display device of one embodiment of the present invention, the light-emitting elements are arranged in a matrix in the display portion, and an image can be displayed on the display portion. Furthermore, the light-receiving elements are arranged in a matrix in the display portion, and the display portion has one or both of an image capturing function and a sensing function. The display portion can be used as an image sensor or a touch sensor. That is, by detecting light with the display portion, an image can be captured and the approach or contact of an object (e.g., a finger or a stylus) can be detected. Furthermore, in the display device of one embodiment of the present invention, the light-emitting elements can be used as alight source of the sensor. Accordingly, alight-receiving portion and a light source do not need to be provided separately from the display device; hence, the number of components of an electronic device can be reduced.

In the display device of one embodiment of the present invention, when an object reflects (or scatters) light emitted by the light-emitting element included in the display portion, the light-receiving element can detect the reflected light (or the scattered light); thus, image capturing and a touch operation detection are possible even in a dark place.

The display device of one embodiment of the present invention has a function of displaying an image with the use of a light-emitting element. That is, the light-emitting element functions as a display element (also referred to as a display device).

As the light-emitting element, an EL element (also referred to as an EL device) such as an OLED (Organic Light Emitting Diode) or a QLED (Quantum-dot Light Emitting Diode) is preferably used. As alight-emitting substance contained in the EL element, a substance emitting fluorescence (a fluorescent material), a substance emitting phosphorescence (a phosphorescent material), an inorganic compound (such as a quantum dot material), a substance exhibiting thermally activated delayed fluorescence (a thermally activated delayed fluorescence (TADF) material), or the like can be given. Alternatively, an LED (a light-emitting diode) such as a micro-LED can be used as the light-emitting element.

The display device of one embodiment of the present invention has a function of detecting light with the use of a light-receiving element.

When the light-receiving element is used as an image sensor, the display device can capture an image using the light-receiving element. For example, the display device of this embodiment can be used as a scanner.

For example, data on biological information of a fingerprint, a palm print, or the like can be obtained with the use of the image sensor. That is, a biological authentication sensor can be incorporated in the display device. When the display device incorporates a biological authentication sensor, the number of components of an electronic device can be reduced as compared to the case where a biological authentication sensor is provided separately from the display device; thus, the size and weight of the electronic device can be reduced.

When the light-receiving element is used as the touch sensor, the display device can detect the approach or contact of an object with the use of the light-receiving element.

As the light-receiving element, a pn photodiode or a pin photodiode can be used, for example. The light-receiving element functions as a photoelectric conversion element (also referred to as a photoelectric conversion device) that detects light entering the light-receiving element and generates charge. The amount of charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display device including the organic EL elements.

If all the layers of the organic EL elements and the organic photodiodes are formed separately, the number of deposition steps becomes extremely large. Since a large number of layers of the organic photodiodes can have structures in common with the organic EL elements, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer is preferably a layer shared by the light-receiving element and the light-emitting element. As another example, the light-receiving element and the light-emitting element can have the same structure except that the light-receiving element includes an active layer and the light-emitting element includes a light-emitting layer. In other words, the light-receiving element can be manufactured by only replacing the light-emitting layer of the light-emitting element with an active layer. When the light-receiving element and the light-emitting element include common layers in such a manner, the number of deposition steps and the number of masks can be reduced, thereby reducing the number of manufacturing steps and the manufacturing cost of the display device. Furthermore, the display device including the light-receiving element can be manufactured using an existing manufacturing apparatus and an existing manufacturing method for the display device.

Note that a layer shared by the light-receiving element and the light-emitting element might have functions different in the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element. Note that a layer shared by the light-receiving element and the light-emitting element may have the same functions in the light-emitting element and the light-receiving element. The hole-transport layer functions as a hole-transport layer in both of the light-emitting element and the light-receiving element, and the electron-transport layer functions as an electron-transport layer in both of the light-emitting element and the light-receiving element.

Next, a display device including a light-emitting and light-receiving element and a light-emitting element is described.

In the display device of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the display portion of the display device of one embodiment of the present invention has a function of displaying an image using both a light-emitting and light-receiving element and a light-emitting element.

The light-emitting and light-receiving element functions as both a light-emitting element and a light-receiving element, whereby the pixel can have a light-receiving function without an increase in the number of subpixels included in the pixel. Thus, the display portion of the display device can be provided with one or both of an image capturing function and a sensing function while keeping the aperture ratio of the pixel (aperture ratio of each subpixel) and the resolution of the display device. Accordingly, in the display device of one embodiment of the present invention, the aperture ratio of the pixel can be more increased and the resolution can be increased more easily than in a display device provided with a subpixel including a light-receiving element separately from a subpixel including a light-emitting element.

In in the display portion in the display device of one embodiment of the present invention, the light-emitting and light-receiving elements and the light-emitting elements are arranged in a matrix, and an image can be displayed on the display portion. The display portion can be used as an image sensor or a touch sensor. Furthermore, in the display device of one embodiment of the present invention, the light-emitting elements can be used as a light source of the sensor. Accordingly, a light-receiving portion and a light source do not need to be provided separately from the display device; hence, the number of components of an electronic device can be reduced.

In the display device of one embodiment of the present invention, when an object reflects (or scatters) light emitted by the light-emitting element included in the display portion, the light-emitting and light-receiving element can detect the reflected light (or the scattered light); thus, image capturing and a touch operation detection are possible even in a dark place.

The light-emitting and light-receiving element can be manufactured by combining an organic EL element and an organic photodiode. For example, by adding an active layer of an organic photodiode to a layered structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer of the light-receiving element. In other words, the light-emitting and light-receiving element can be manufactured by only adding the active layer of the light-receiving element to the light-emitting element. When the light-emitting and light-receiving element and the light-emitting element include common layers in such a manner, the number of deposition steps and the number of masks can be reduced, thereby reducing the number of manufacturing steps and the manufacturing cost of the display device. Furthermore, the display device including the light-emitting and light-receiving element can be manufactured using an existing manufacturing apparatus and an existing manufacturing method for the display device.

Note that a layer included in the light-emitting and light-receiving element might have a different function between the case where the light-emitting and light-receiving element functions as the light-receiving element and the case where the light-emitting and light-receiving element functions as the light-emitting element. In this specification, the name of a component is based on its function in the case where the light-emitting and light-receiving element functions as a light-emitting element. For example, a hole-injection layer functions as a hole-injection layer in the case where the light-emitting and light-receiving element functions as the light-emitting element, and functions as a hole-transport layer in the case where the light-emitting and light-receiving element functions as the light-receiving element. Similarly, an electron-injection layer functions as an electron-injection layer in the case where the light-emitting and light-receiving element functions as the light-emitting element, and functions as an electron-transport layer in the case where the light-emitting and light-receiving element function as the light-receiving element. A layer included in the light-emitting and light-receiving element may have the same function in both the case where the light-emitting and light-receiving element functions as the light-receiving element and the case where the light-emitting and light-receiving element functions as the light-emitting element. The hole-transport layer functions as a hole-transport layer in the case where the light-emitting and light-receiving element functions as either a light-emitting element or a light-receiving element, and the electron-transport layer functions as an electron-transport layer in the case where the light-emitting and light-receiving element functions as either a light-emitting element or a light-receiving element.

The display device of this embodiment has a function of displaying an image with the use of a light-emitting element and a light-emitting and light-receiving element. That is, the light-emitting element and the light-emitting and light-receiving element function as a display element.

The display device of this embodiment has a function of detecting light with the use of a light-emitting and light-receiving element. The light-emitting and light-receiving element can detect light having a shorter wavelength than light emitted by the light-emitting and light-receiving element itself.

When the light-emitting and light-receiving element is used as an image sensor, the display device of this embodiment can capture an image using the light-emitting and light-receiving element. For example, the display device of this embodiment can be used as a scanner.

When the light-emitting and light-receiving element is used as the touch sensor, the display device of this embodiment can detect the approach or contact of an object with the use of the light-emitting and light-receiving element.

The light-emitting and light-receiving element functions as a photoelectric conversion element that detects light entering the light-emitting and light-receiving element and generates charge. The amount of charge generated from the light-emitting and light-receiving element depends on the amount of light entering the light-emitting and light-receiving element.

The light-emitting and light-receiving element can be manufactured by adding an active layer of the light-receiving element to the above-described structure of the light-emitting element.

A pn or pin photodiode structure can be applied to the light-emitting and light-receiving element, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of display devices.

The display device of one embodiment of the present invention is specifically described below with reference to drawings.

[Display Device]

FIG. 6A to FIG. 6D and FIG. 6F illustrate cross-sectional views of display devices of embodiments of the present invention.

A display device 200A illustrated in FIG. 6A includes a layer 203 including a light-receiving element, a functional layer 205, and a layer 207 including a light-emitting element between a substrate 201 and a substrate 209.

In the display device 200A, red (R) light, green (G) light, and blue (B) light are emitted from the layer 207 including a light-emitting element.

The light-receiving element included in the layer 203 including a light-receiving element can detect light that enters from the outside of the display device 200A.

A display device 200B illustrated in FIG. 6B includes a layer 204 including a light-emitting and light-receiving element, the functional layer 205, and the layer 207 including a light-emitting element between the substrate 201 and the substrate 209.

In the display device 200B, green (G) light and blue (B) light are emitted from the layer 207 including a light-emitting element, and red (R) light is emitted from the layer 204 including a light-emitting and light-receiving element. In the display device of one embodiment of the present invention, the color of light emitted by the layer 204 including a light-emitting and light-receiving element is not limited to red. Furthermore, the color of light emitted by the layer 207 including a light-emitting element is not limited to the combination of green and blue.

The light-emitting and light-receiving element included in the layer 204 including a light-emitting and light-receiving element can detect light that enters from the outside of the display device 200B. The light-emitting and light-receiving element can detect one or both of green (G) light and blue (B) light, for example.

The functional layer 205 includes a circuit for driving the light-receiving element or the light-emitting and light-receiving element and a circuit for driving the light-emitting element. A switch, a transistor, a capacitor, a resistor, a wiring, a terminal, and the like can be provided in the functional layer 205. Note that in the case where the light-emitting element and the light-receiving element are driven by a passive-matrix method, a structure not provided with a switch or a transistor may be employed.

The display device of one embodiment of the present invention may have a function of detecting an object such as a finger that is touching the display device (a function of a touch panel). For example, after light emitted by the light-emitting element in the layer 207 including a light-emitting element is reflected by a finger 202 that is touching the display device 200A as illustrated in FIG. 6C, the light-receiving element in the layer 203 including a light-receiving element detects the reflected light. Thus, the touch of the finger 202 on the display device 200A can be detected. Furthermore, in the display device 200B, after light emitted by the light-emitting element in the layer 207 including a light-emitting element is reflected by a finger that is touching the display device 200B, the light-emitting and light-receiving element in the layer 204 including a light-emitting and light-receiving element can detect the reflected light. Although a case where light emitted by the light-emitting element is reflected by an object is described below as an example, light might be scattered by an object.

The display device of one embodiment of the present invention may have a function of detecting an object that is close to (but is not touching) the display device as illustrated in FIG. 6D or capturing an image of such an object.

The display device of one embodiment of the present invention may have a function of detecting a fingerprint of the finger 202. FIG. 6E illustrates a diagram of an image captured by the display device of one embodiment of the present invention. In an image-capturing range 263 in FIG. 6E, the outline of the finger 202 is indicated by a dashed line and the outline of a contact portion 261 is indicated by a dashed-dotted line. In the contact portion 261, a high-contrast image of a fingerprint 262 can be captured owing to a difference in the amount of light entering the light-receiving element (or the light-emitting and light-receiving element).

The display device of one embodiment of the present invention can also function as a pen tablet. FIG. 6F illustrates a state in which a tip of a stylus 208 slides in a direction indicated by a dashed arrow while the tip of the stylus 208 touches the substrate 209.

As illustrated in FIG. 6F, when the scattered light scattered by the contact surface between the tip of the stylus 208 and the substrate 209 enters the light-receiving element (or the light-emitting and light-receiving element) that is positioned in a portion overlapping with the contact surface, the position of the tip of the stylus 208 can be detected with high accuracy.

FIG. 6G illustrates an example of a path 266 of the stylus 208 that is detected by the display device of one embodiment of the present invention. The display device of one embodiment of the present invention can detect the position of an object to be detected, such as the stylus 208, with high position accuracy, so that high-definition drawing can be performed using a drawing application or the like. Unlike the case of using a capacitive touch sensor, an electromagnetic induction touch pen, or the like, the display device can detect even the position of a highly insulating object to be detected, the material of a tip portion of the stylus 208 is not limited, and a variety of writing materials (e.g., a brush, a glass pen, a quill pen, and the like) can be used.

[Pixel]

The display device of one embodiment of the present invention includes a plurality of pixels arranged in a matrix. One pixel includes a plurality of subpixels. One subpixel includes one light-emitting element, one light-emitting and light-receiving element, or one light-receiving element.

The plurality of pixels each include one or more of a subpixel including a light-emitting element, a subpixel including a light-receiving element, and a subpixel including a light-emitting and light-receiving element.

For example, the pixel includes a plurality of (e.g., three or four) subpixels each including a light-emitting element and one subpixel including a light-receiving element.

Note that the light-receiving element may be provided in all the pixels or may be provided in some of the pixels. In addition, one pixel may include a plurality of light-receiving elements. One light-receiving element may be provided across a plurality of pixels. The resolution of the light-receiving element may be different from the resolution of the light-emitting element.

In the case where the pixel includes three subpixels each including a light-emitting element, as the three subpixels, subpixels of three colors of RGB, subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

FIG. 6H, FIG. 6J, FIG. 6K, and FIG. 6L illustrate examples of a pixel which includes a plurality of subpixels each including a light-emitting element and includes one subpixel including a light-receiving element. Note that the arrangement of subpixels is not limited to the illustrated order in this embodiment. For example, the positions of a subpixel (B) and a subpixel (G) may be reversed.

The pixels illustrated in FIG. 6H, FIG. 6J, and FIG. 6K each include a subpixel (PD) having a light-receiving function, a subpixel (R) that exhibits red light, a subpixel (G) that exhibits green light, and a subpixel (B) that exhibits blue light.

Matrix arrangement is applied to the pixel illustrated in FIG. 6H, and stripe arrangement is applied to the pixel illustrated in FIG. 6J. FIG. 6K illustrates an example in which the subpixel (R) that exhibits red light, the subpixel (G) that exhibits green light, and the subpixel (B) that exhibits blue light are arranged laterally in one row and the subpixel (PD) having a light-receiving function is arranged thereunder. In other words, in FIG. 6K, the subpixel (R), the subpixel (G), and the subpixel (B) are arranged in the same row, which is different from the row in which the subpixel (PD) is provided.

The pixel illustrated in FIG. 6L includes a subpixel (X) that exhibits light of a color other than RGB, in addition to the components of the pixel illustrated in FIG. 6K. The light of a color other than RGB can be white (W) light, yellow (Y) light, cyan (C) light, magenta (M) light, infrared light (IR), or the like. In the case where the subpixel (X) exhibits infrared light, the subpixel (PD) having a light-receiving function preferably has a function of detecting infrared light. The subpixel (PD) having a light-receiving function may have a function of detecting both visible light and infrared light. The wavelength of light detected by the light-receiving element can be determined depending on the application of a sensor.

Alternatively, for example, the pixel includes a plurality of subpixels each including a light-emitting element and one subpixel including a light-emitting and light-receiving element.

The display device including the light-emitting and light-receiving element has no need to change the pixel arrangement when incorporating a light-receiving function into pixels; thus, a display portion can be provided with one or both of an image capturing function and a sensing function without reductions in aperture ratio and resolution.

Note that the light-emitting and light-receiving element may be provided in all the pixels or may be provided in some of the pixels. In addition, one pixel may include a plurality of light-emitting and light-receiving elements.

FIG. 7A to FIG. 7D illustrate examples of a pixel which includes a plurality of subpixels each including a light-emitting element and includes one subpixel including a light-emitting and light-receiving element.

Figure 7A:
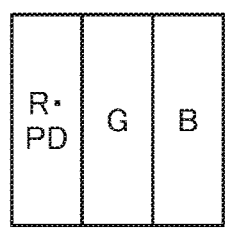
FIG. 7A to FIG. 7G are top views illustrating examples of a pixel.

A pixel illustrated in FIG. 7A employs stripe arrangement and includes a subpixel (R•PD) that exhibits red light and has a light-receiving function, a subpixel (G) that exhibits green light, and a subpixel (B) that exhibits blue light. In a display device including a pixel composed of three subpixels of RGB, a light-emitting element used in the R subpixel can be replaced with a light-emitting and light-receiving element, so that the display device can have a light-receiving function in the pixel.

Figure 7B:
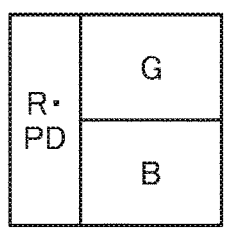

A pixel illustrated in FIG. 7B includes a subpixel (R•PD) that exhibits red light and has a light-receiving function, a subpixel (G) that exhibits green light, and a subpixel (B) that exhibits blue light. The subpixel (R•PD) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 7E:
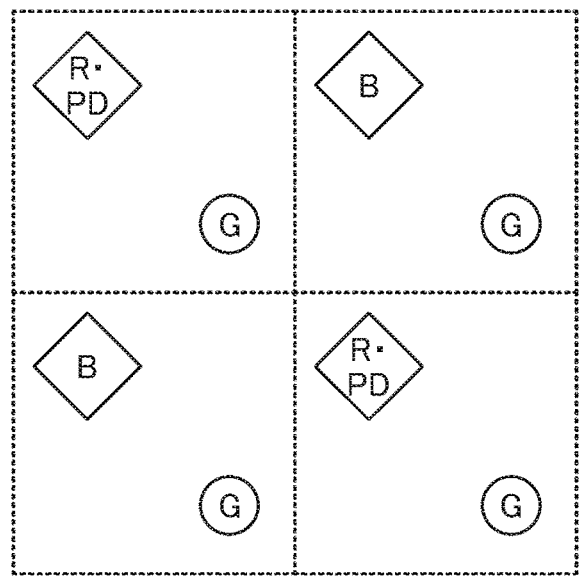
Figure 7C:
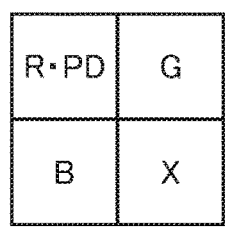

A pixel illustrated in FIG. 7C employs matrix arrangement and includes a subpixel (R•PD) that exhibits red light and has a light-receiving function, a subpixel (G) that exhibits green light, a subpixel (B) that exhibits blue light, and a subpixel (X) that exhibits light of a color other than RGB. Also in a display device including a pixel composed of four subpixels of RGBX, a light-emitting element used in the R subpixel can be replaced with a light-emitting and light-receiving element, so that the display device can have a light-receiving function in the pixel.

Figure 7D:
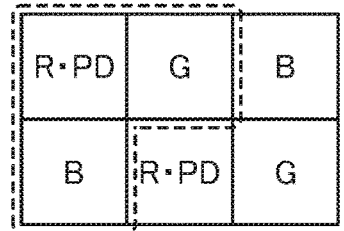

FIG. 7D illustrates two pixels, each of which is composed of three subpixels surrounded by dotted lines. The pixels illustrated in FIG. 7D each include a subpixel (R•PD) that exhibits red light and has a light-receiving function, a subpixel (G) that exhibits green light, and a subpixel (B) that exhibits blue light. In the pixel on the left in FIG. 7D, the subpixel (G) is positioned in the same row as the subpixel (R•PD), and the subpixel (B) is positioned in the same column as the subpixel (R•PD). In the pixel on the right in FIG. 7D, the subpixel (G) is positioned in the same row as the subpixel (R•PD), and the subpixel (B) is positioned in the same column as the subpixel (G). In every odd-numbered row and every even-numbered row of the pixel layout illustrated in FIG. 7D, the subpixel (R•PD), the subpixel (G), and the subpixel (B) are repeatedly arranged. In addition, subpixels of different colors are arranged in the odd-numbered row and the even-numbered row in every column.

Figure 7F:
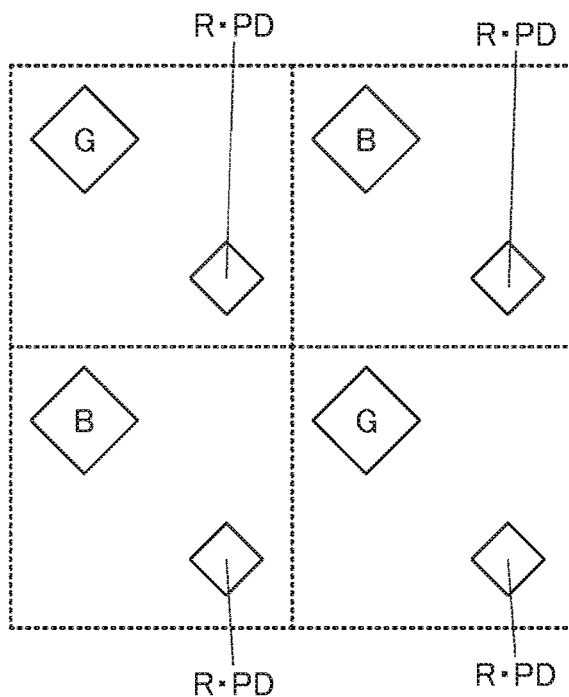

FIG. 7E illustrates four pixels which employ pentile arrangement; adjacent two pixels each have a different combination of two subpixels that exhibit light of different colors. Note that the shape of the subpixels illustrated in FIG. 7E indicates a top-surface shape of the light-emitting elements and the light-emitting and light-receiving elements included in the subpixels. FIG. 7F is a modification example of the pixel arrangement of FIG. 7E.

The upper-left pixel and the lower-right pixel in FIG. 7E each include a subpixel (R•PD) that exhibits red light and has a light-receiving function and a subpixel (G) that exhibits green light. The lower-left pixel and the upper-right pixel in FIG. 7E each include a subpixel (G) that exhibits green light and a subpixel (B) that exhibits blue light.

The upper-left pixel and the lower-right pixel in FIG. 7F each include a subpixel (R•PD) that exhibits red light and has a light-receiving function and a subpixel (G) that exhibits green light. The lower-left pixel and the upper-right pixel in FIG. 7F each include a subpixel (R•PD) that exhibits red light and has a light-receiving function and a subpixel (B) that exhibits blue light.

In FIG. 7E, the subpixel (G) that exhibits green light is provided in each pixel. Meanwhile, in FIG. 7F, the subpixel (R•PD) that exhibits red light and has a light-receiving function is provided in each pixel. The structure illustrated in FIG. 7F achieves higher-resolution image capturing than the structure illustrated in FIG. 7E because of having a subpixel having a light-receiving function in each pixel. Thus, the accuracy of biometric authentication can be increased, for example.

The top-surface shape of the light-emitting elements and the light-emitting and light-receiving elements is not particularly limited and can be a circular shape, an elliptical shape, a polygonal shape, a polygonal shape with rounded corners, or the like. The top-surface shape of the light-emitting elements included in the subpixels (G) is a circular in the example in FIG. 7E and square in the example in FIG. 7F. The top surface shape of the light-emitting elements and the light-emitting and light-receiving elements may vary depending on the color thereof, or the light-emitting elements and the light-emitting and light-receiving elements of some colors or every color may have the same top-surface shape.

The aperture ratio of subpixels may vary depending on the color of the subpixels, or may be the same among the subpixels of some colors or every color. For example, the aperture ratio of a subpixel of a color provided in each pixel (the subpixel (G) in FIG. 7E, and the subpixel (R•PD) in FIG. 7F) may be made lower than those of subpixels of the other colors.

Figure 7G:
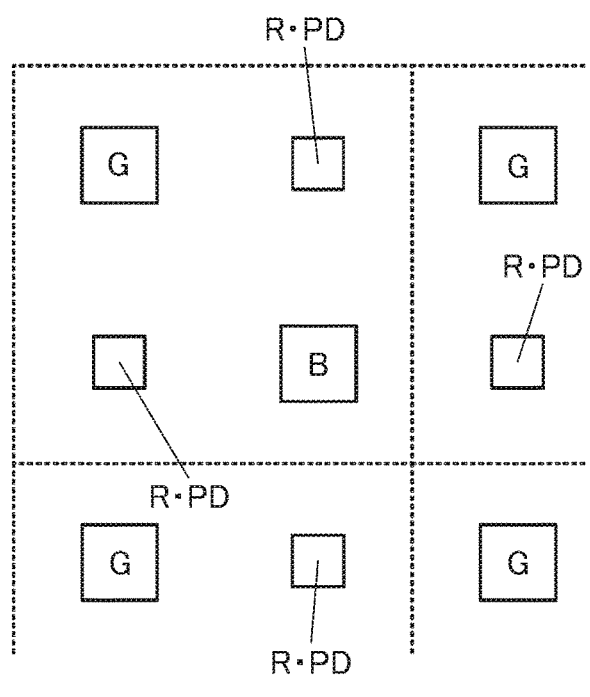

FIG. 7G is a modification example of the pixel arrangement of FIG. 7F. Specifically, the structure of FIG. 7G is obtained by rotating the structure of FIG. 7F by 45°. Although one pixel is regarded as being formed of two subpixels in FIG. 7F, one pixel can be regarded as being formed of four subpixels as illustrated in FIG. 7G.

In the description with reference to FIG. 7G, one pixel is regarded as being formed of four subpixels surrounded by dotted lines. A pixel includes two subpixels (R•PD), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display device which employs the structure illustrated in FIG. 7F or FIG. 7G includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emits green light, and the other light-emitting elements emit blue light. The light-emitting and light-receiving elements emit red light and have a light-receiving function.

In the case where a touch operation is detected with the light-emitting and light-receiving elements, for example, it is preferable that light emitted by a light source be hard for a user to recognize. Since blue light has low visibility than green light, light-emitting elements that emit blue light are preferably used as a light source. Accordingly, the light-emitting and light-receiving elements preferably have a function of receiving blue light.

As described above, the display device of this embodiment can employ any of various types of pixel arrangements.

[Device Structure]

Next, detailed structures of the light-emitting element, the light-receiving element, and the light-emitting and light-receiving element which can be used in the display device of one embodiment of the present invention are described.

The display device of one embodiment of the present invention can have any of the following structures: a top-emission structure in which light is emitted in a direction opposite to the substrate where the light-emitting element is formed, a bottom-emission structure in which light is emitted toward the substrate where the light-emitting element is formed, and a dual-emission structure in which light is emitted toward both surfaces.

In this embodiment, a top-emission display device is described as an example.

In this specification and the like, unless otherwise specified, in describing a structure including a plurality of components (e.g., light-emitting elements or light-emitting layers), alphabets are not added when a common part for the components is described. For example, when a common part of a light-emitting layer 283R, a light-emitting layer 283G, and the like is described, the light-emitting layers are simply referred to as the light-emitting layer 283, in some cases.

Figure 8A:
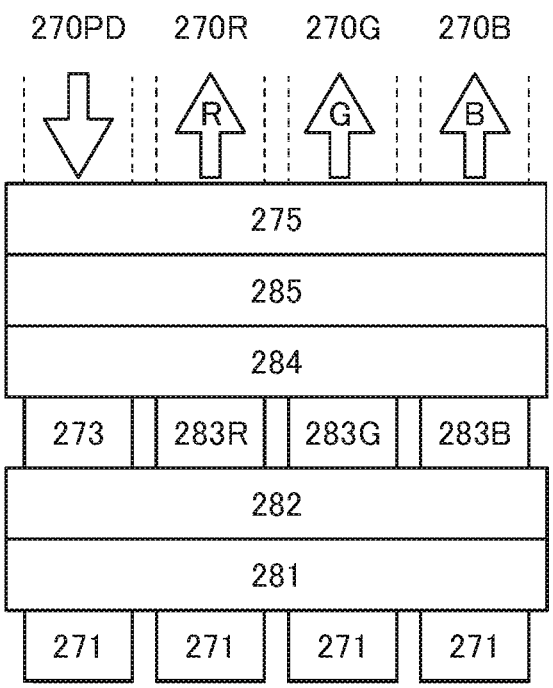
FIG. 8A and FIG. 8B are cross-sectional views illustrating examples of a display device.

A display device 280A illustrated in FIG. 8A includes a light-receiving element 270PD, a light-emitting element 270R that emits red (R) light, a light-emitting element 270G that emits green (G) light, and a light-emitting element 270B that emits blue (B) light.

Each of the light-emitting elements includes a pixel electrode 271, a hole-injection layer 281, a hole-transport layer 282, a light-emitting layer, an electron-transport layer 284, an electron-injection layer 285, and a common electrode 275 which are stacked in this order. The light-emitting element 270R includes the light-emitting layer 283R, the light-emitting element 270G includes the light-emitting layer 283G, and the light-emitting element 270B includes a light-emitting layer 283B. The light-emitting layer 283R includes a light-emitting substance that emits red light, the light-emitting layer 283G includes a light-emitting substance that emits green light, and the light-emitting layer 283B includes a light-emitting substance that emits blue light.

The light-emitting elements are electroluminescent elements that emit light to the common electrode 275 side by voltage application between the pixel electrodes 271 and the common electrode 275.

The light-receiving element 270PD includes the pixel electrode 271, the hole-injection layer 281, the hole-transport layer 282, an active layer 273, the electron-transport layer 284, the electron-injection layer 285, and the common electrode 275 which are stacked in this order.

The light-receiving element 270PD is a photoelectric conversion element that receives light entering from the outside of the display device 280A and converts it into an electric signal.

In the description made in this embodiment, the pixel electrode 271 functions as an anode and the common electrode 275 functions as a cathode in both of the light-emitting element and the light-receiving element. In other words, when the light-receiving element is driven by application of reverse bias between the pixel electrode 271 and the common electrode 275, light entering the light-receiving element can be detected and charge can be generated and extracted as current.

In the display device of this embodiment, an organic compound is used for the active layer 273 of the light-receiving element 270PD. In the light-receiving element 270PD, the layers other than the active layer 273 can have structures in common with the layers in the light-emitting elements. Therefore, the light-receiving element 270PD can be formed concurrently with the formation of the light-emitting elements only by adding a step of depositing the active layer 273 in the manufacturing process of the light-emitting elements. The light-emitting elements and the light-receiving element 270PD can be formed over one substrate. Accordingly, the light-receiving element 270PD can be incorporated into the display device without a significant increase in the number of manufacturing steps.

The display device 280A is an example in which the light-receiving element 270PD and the light-emitting elements have a common structure except that the active layer 273 of the light-receiving element 270PD and the light-emitting layers 283 of the light-emitting elements are separately formed. Note that the structures of the light-receiving element 270PD and the light-emitting elements are not limited thereto. The light-receiving element 270PD and the light-emitting elements may include separately formed layers other than the active layer 273 and the light-emitting layers 283. The light-receiving element 270PD and the light-emitting elements preferably include at least one layer used in common (common layer). Thus, the light-receiving element 270PD can be incorporated into the display device without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting elements included in the display device of this embodiment preferably employs a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode).

The light transmittance of the transparent electrode is greater than or equal to 40%. For example, an electrode having a visible light (light at wavelengths greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity less than or equal to $1 \times 10^{-2}$ Ωcm. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 283. The light-emitting element may further include, as a layer other than the light-emitting layer 283, a layer containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (electron-accepting material) can be used.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer including a hole-transport material. As the hole-transport material, a substance having a hole mobility greater than or equal to $10^{-6}$ cm$^2$/Vs is preferable. Note that other substances can also be used as long as they have a property of transporting more holes than electrons. As the hole-transport material, materials having a high hole-transport property, such as a t-electron-rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer including an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 is a layer containing a light-emitting substance. The light-emitting layer 283 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material are a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 283 may contain one or more kinds of organic compounds (e.g., a host material and an assist material) in addition to the light-emitting substance (a guest material). As the one or more kinds of organic compounds, one or both of the hole-transport material and the electron-transport material can be used. As the one or more kinds of organic compounds, a bipolar material or a TADF material may be used.

The light-emitting layer 283 preferably includes a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (the highest occupied molecular orbital level) of the hole-transport material is preferably higher than or equal to the HOMO level of the electron-transport material. The LUMO level (the lowest unoccupied molecular orbital level) of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 273 includes a semiconductor. Examples of the semiconductor include an inorganic semiconductor such as silicon and an organic semiconductor including an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material included in the active layer 273 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 273 include electron-donating organic semiconductor materials such as copper(II) phthalocyanine (CuPc), tetraphenyldibenzoperiflanthene (DBP), or zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 273 is preferably formed by co-evaporation of an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

Figure 8B:
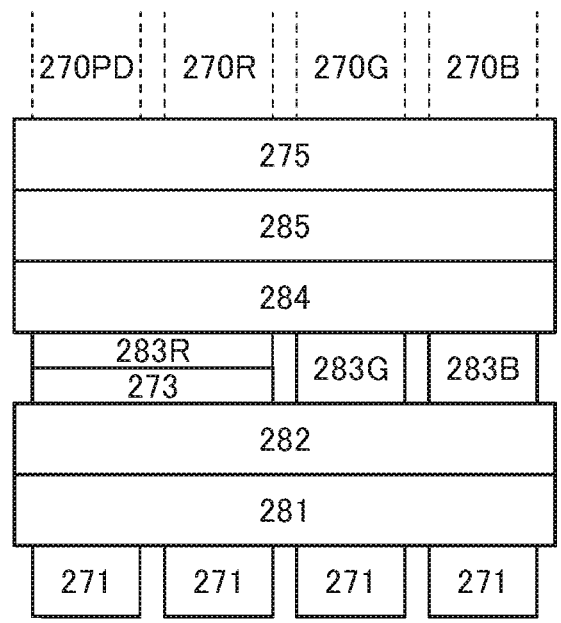

A display device 280B illustrated in FIG. 8B is different from the display device 280A in that the light-receiving element 270PD and the light-emitting element 270R have the same structure.

The light-receiving element 270PD and the light-emitting element 270R share the active layer 273 and the light-emitting layer 283R.

Here, it is preferable that the light-receiving element 270PD have a structure in common with the light-emitting element that emits light with a wavelength longer than that of the light desired to be detected. For example, the light-receiving element 270PD having a structure in which blue light is detected can have a structure which is similar to that of one or both of the light-emitting element 270R and the light-emitting element 270G. For example, the light-receiving element 270PD having a structure in which green light is detected can have a structure similar to that of the light-emitting element 270R.

When the light-receiving element 270PD and the light-emitting element 270R have a common structure, the number of deposition steps and the number of masks can be smaller than those for the structure in which the light-receiving element 270PD and the light-emitting element 270R include separately formed layers. As a result, the number of manufacturing steps and the manufacturing cost of the display device can be reduced.

When the light-receiving element 270PD and the light-emitting element 270R have a common structure, a margin for misalignment can be narrower than that for the structure in which the light-receiving element 270PD and the light-emitting element 270R include separately formed layers. Accordingly, the aperture ratio of a pixel can be increased, so that the light extraction efficiency of the display device can be increased. This can extend the life of the light-emitting element. Furthermore, the display device can exhibit a high luminance. Moreover, the definition of the display device can also be increased.

The light-emitting layer 283R includes a light-emitting material that emits red light. The active layer 273 contains an organic compound that absorbs light with a wavelength shorter than that of red light (e.g., one or both of green light and blue light). The active layer 273 preferably contains an organic compound that does not easily absorb red light and that absorbs light with a wavelength shorter than that of red light. In this way, red light can be efficiently extracted from the light-emitting element 270R, and the light-receiving element 270PD can detect light with a wavelength shorter than that of red light at high accuracy.

Although the light-emitting element 270R and the light-receiving element 270PD have the same structure in an example of the display device 280B, the light-emitting element 270R and the light-receiving element 270PD may include optical adjustment layers with different thicknesses.

Figure 9A:
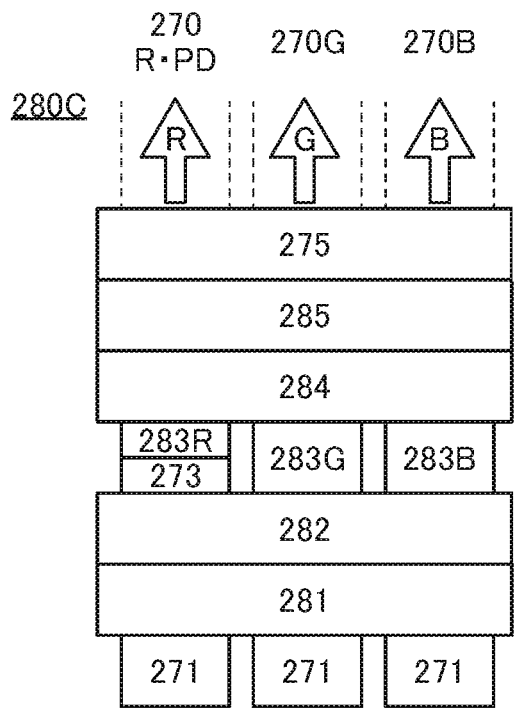
FIG. 9A and FIG. 9B are cross-sectional views illustrating examples of a display device.
Figure 9B:
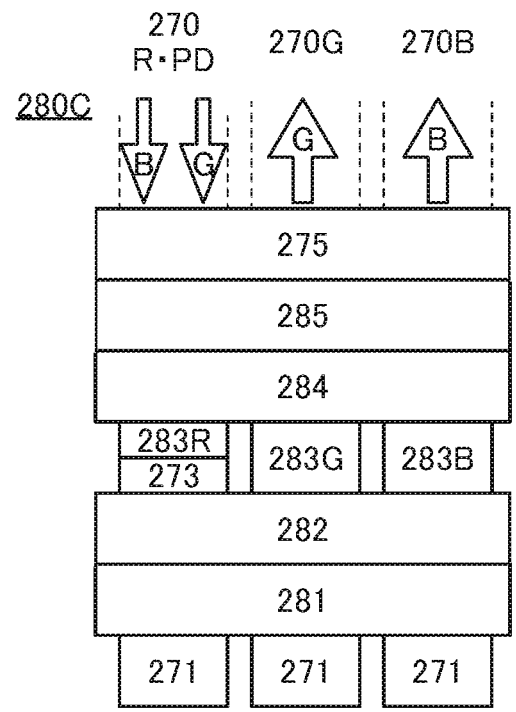

A display device 280C illustrated in FIG. 9A and FIG. 9B includes a light-emitting and light-receiving element 270R•PD that emits red (R) light and has a light-receiving function, the light-emitting element 270G that emits green (G) light, and the light-emitting element 270B that emits blue (B) light.

Each of the light-emitting elements includes the pixel electrode 271, the hole-injection layer 281, the hole-transport layer 282, a light-emitting layer, the electron-transport layer 284, the electron-injection layer 285, and the common electrode 275 which are stacked in this order. The light-emitting element 270G includes the light-emitting layer 283G, and the light-emitting element 270B includes the light-emitting layer 283B. The light-emitting layer 283G includes a light-emitting substance that emits green light, and the light-emitting layer 283B includes a light-emitting substance that emits blue light.

The light-emitting and light-receiving element 270R•PD includes the pixel electrode 271, the hole-injection layer 281, the hole-transport layer 282, the active layer 273, the light-emitting layer 283R, the electron-transport layer 284, the electron-injection layer 285, and the common electrode 275 which are stacked in this order.

Note that the light-emitting and light-receiving element 270R•PD included in the display device 280C has the same structure as the light-emitting element 270R and the light-receiving element 270PD included in the display device 280B. Furthermore, the light-emitting elements 270G and 270B included in the display device 280C also have the same structures as the light-emitting elements 270G and 270B, which are included in the display device 280B.

FIG. 9A illustrates a case where the light-emitting and light-receiving element 270R•PD functions as a light-emitting element. In the example of FIG. 9A, the light-emitting element 270B emits blue light, the light-emitting element 270G emits green light, and the light-emitting and light-receiving element 270R•PD emits red light.

FIG. 9B illustrates a case where the light-emitting and light-receiving element 270R•PD functions as a light-receiving element. In the example of FIG. 9B, the light-emitting and light-receiving element 270R•PD detects blue light emitted by the light-emitting element 270B and green light emitted by the light-emitting element 270G.

The light-emitting element 270B, the light-emitting element 270G, and the light-emitting and light-receiving element 270R•PD each include the pixel electrode 271 and the common electrode 275. In this embodiment, the case where the pixel electrode 271 functions as an anode and the common electrode 275 functions as a cathode is described as an example.

In the description made in this embodiment, also in the light-emitting and light-receiving element 270R•PD, the pixel electrode 271 functions as an anode and the common electrode 275 functions as a cathode as in the light-emitting element. In other words, when the light-emitting and light-receiving element 270R•PD is driven by application of reverse bias between the pixel electrode 271 and the common electrode 275, light entering the light-emitting and light-receiving element 270R•PD can be detected and charge can be generated and extracted as current.

Note that it can be said that the light-emitting and light-receiving element 270R•PD illustrated in FIG. 9A and FIG. 9B has a structure in which the active layer 273 is added to the light-emitting element. That is, the light-emitting and light-receiving element 270R•PD can be formed concurrently with the formation of the light-emitting element only by adding a step of depositing the active layer 273 in the manufacturing process of the light-emitting element. The light-emitting element and the light-emitting and light-receiving element can be formed over one substrate. Thus, one or both of an image capturing function and a sensing function can be provided to the display portion without a significant increase in the number of manufacturing steps.

The stacking order of the light-emitting layer 283R and the active layer 273 is not limited. FIG. 9A and FIG. 9B each illustrate an example in which the active layer 273 is provided over the hole-transport layer 282, and the light-emitting layer 283R is provided over the active layer 273. The light-emitting layer 283R may be provided over the hole-transport layer 282, and the active layer 273 may be provided over the light-emitting layer 283R.

As illustrated in FIG. 9A and FIG. 9B, the active layer 273 and the light-emitting layer 283R may be in contact with each other. Furthermore, a buffer layer may be interposed between the active layer 273 and the light-emitting layer 283R. As the buffer layer, at least one layer of a hole-injection layer, a hole-transport layer, an electron-transport layer, an electron-injection layer, a hole-blocking layer, an electron-blocking layer, and the like can be used.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, high emission efficiency can be obtained from a light-emitting and light-receiving element including the buffer layer between the active layer 273 and the light-emitting layer 283R.

The light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

The light-emitting and light-receiving element may include a layer that serves as both a light-emitting layer and an active layer without including the active layer 273 and the light-emitting layer 283R. As the layer serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and not described in detail.

A detailed structure of the display device of one embodiment of the present invention is described below with reference to FIG. 10 and FIG. 11.

[Display Device 100A]

Figure 10A:
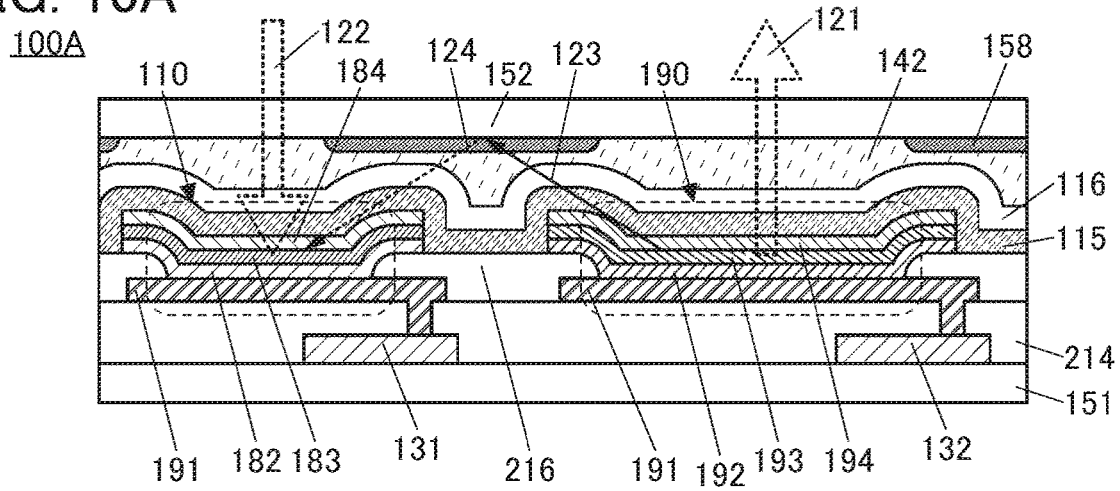
FIG. 10A to FIG. 10C are cross-sectional views illustrating examples of a display device.

FIG. 10A is a cross-sectional view of a display device 100A.

The display device 100A includes a light-receiving element 110 and a light-emitting element 190.

The light-emitting element 190 includes a pixel electrode 191, a buffer layer 192, a light-emitting layer 193, a buffer layer 194, and a common electrode 115 which are stacked in this order. The buffer layer 192 can include one or both of a hole-injection layer and a hole-transport layer. The light-emitting layer 193 contains an organic compound. The buffer layer 194 can include one or both of an electron-injection layer and an electron-transport layer. The light-emitting element 190 has a function of emitting visible light. Note that the display device 100A may also include a light-emitting element having a function of emitting infrared light.

The light-receiving element 110 includes the pixel electrode 191, a buffer layer 182, an active layer 183, a buffer layer 184, and the common electrode 115 which are stacked in this order. The buffer layer 182 can include a hole-transport layer. The active layer 183 contains an organic compound. The buffer layer 184 can include an electron-transport layer. The light-receiving element 110 has a function of detecting visible light. Note that the light-receiving element 110 may also have a function of detecting infrared light.

This embodiment is described assuming that the pixel electrode 191 functions as an anode and the common electrode 115 functions as a cathode in both of the light-emitting element 190 and the light-receiving element 110. In other words, the light-receiving element 110 is driven by application of reverse bias between the pixel electrode 191 and the common electrode 115, so that light entering the light-receiving element 110 can be detected and charge can be generated and extracted as current in the display device 100A.

The pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrodes 191 are positioned over an insulating layer 214. The pixel electrodes 191 can be formed using the same material in the same step. End portions of the pixel electrodes 191 are covered with a partition 216. The two pixel electrodes 191 adjacent to each other are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided instead of the partition 216.

The common electrode 115 is a layer shared by the light-receiving element 110 and the light-emitting element 190.

The material, thickness, and the like of the pair of electrodes can be the same between the light-receiving element 110 and the light-emitting element 190. Accordingly, the manufacturing cost of the display device can be reduced and the manufacturing process of the display device can be simplified.

The display device 100A includes the light-receiving element 110, the light-emitting element 190, a transistor 131, a transistor 132, and the like between a pair of substrates (a substrate 151 and a substrate 152).

In the light-receiving element 110, the buffer layer 182, the active layer 183, and the buffer layer 184, which are positioned between the pixel electrode 191 and the common electrode 115, can each be referred to as an organic layer (a layer containing an organic compound). The pixel electrode 191 preferably has a function of reflecting visible light. The common electrode 115 has a function of transmitting visible light. Note that in the case where the light-receiving element 110 is configured to detect infrared light, the common electrode 115 has a function of transmitting infrared light. Furthermore, the pixel electrode 191 preferably has a function of reflecting infrared light.

The light-receiving element 110 has a function of detecting light. Specifically, the light-receiving element 110 is a photoelectric conversion element that receives light 122 entering from the outside of the display device 100A and converts it into an electric signal. The light 122 can also be expressed as light that is emitted from the light-emitting element 190 and then reflected by an object. The light 122 may enter the light-receiving element 110 through a lens or the like provided in the display device 100A.

In the light-emitting element 190, the buffer layer 192, the light-emitting layer 193, and the buffer layer 194, which are positioned between the pixel electrode 191 and the common electrode 115, can be collectively referred to as an EL layer. The EL layer includes at least the light-emitting layer 193. As described above, the pixel electrode 191 preferably has a function of reflecting visible light. The common electrode 115 has a function of transmitting visible light. Note that in the case where the display device 100A includes a light-emitting element that emits infrared light, the common electrode 115 has a function of transmitting infrared light. Furthermore, the pixel electrode 191 preferably has a function of reflecting infrared light.

The light-emitting element included in the display device of this embodiment preferably employs a micro optical resonator (microcavity) structure.

The buffer layer 192 or the buffer layer 194 may have a function as an optical adjustment layer. By changing the thickness of the buffer layer 192 or the buffer layer 194, light of a particular color can be intensified and taken out from each light-emitting element.

The light-emitting element 190 has a function of emitting visible light. Specifically, the light-emitting element 190 is an electroluminescent element that exhibits light to the substrate 152 side by applying voltage between the pixel electrode 191 and the common electrode 115 (see light emission 121).

The pixel electrode 191 included in the light-receiving element 110 is electrically connected to a source or a drain of the transistor 131 through an opening provided in the insulating layer 214.

The pixel electrode 191 included in the light-emitting element 190 is electrically connected to a source or a drain of the transistor 132 through an opening provided in the insulating layer 214.

The transistor 131 and the transistor 132 are on and in contact with the same layer (the substrate 151 in FIG. 10A).

At least part of a circuit electrically connected to the light-receiving element 110 and a circuit electrically connected to the light-emitting element 190 are preferably formed using the same material in the same step. In that case, the thickness of the display device can be reduced compared with the case where the two circuits are separately formed, resulting in simplification of the manufacturing steps.

The light-receiving element 110 and the light-emitting element 190 are preferably covered with a protective layer 116. In FIG. 10A, the protective layer 116 is provided on and in contact with the common electrode 115. Providing the protective layer 116 can inhibit entry of impurities such as water into the light-receiving element 110 and the light-emitting element 190, so that the reliability of the light-receiving element 110 and the light-emitting element 190 can be increased. The protective layer 116 and the substrate 152 are bonded to each other with an adhesive layer 142.

A light shielding layer 158 is provided on a surface of the substrate 152 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display device 100A and enters the light-receiving element 110 without through an object. The light shielding layer 158 can reduce the influence of such stray light. For example, in the case where the light shielding layer 158 is not provided, light 123 emitted from the light-emitting element 190 is reflected by the substrate 152 and reflected light 124 enters the light-receiving element 110 in some cases. Providing the light shielding layer 158 can inhibit entry of the reflected light 124 into the light-receiving element 110. Consequently, noise can be reduced, and the sensitivity of a sensor using the light-receiving element 110 can be increased.

For the light shielding layer 158, a material that blocks light emitted from the light-emitting element can be used. The light shielding layer 158 preferably absorbs visible light. As the light shielding layer 158, a black matrix can be formed using a metal material or a resin material containing pigment (e.g., carbon black) or dye, for example. The light shielding layer 158 may have a stacked-layer structure of a red color filter, a green color filter, and a blue color filter.

[Display Device 100B]

Figure 10B:
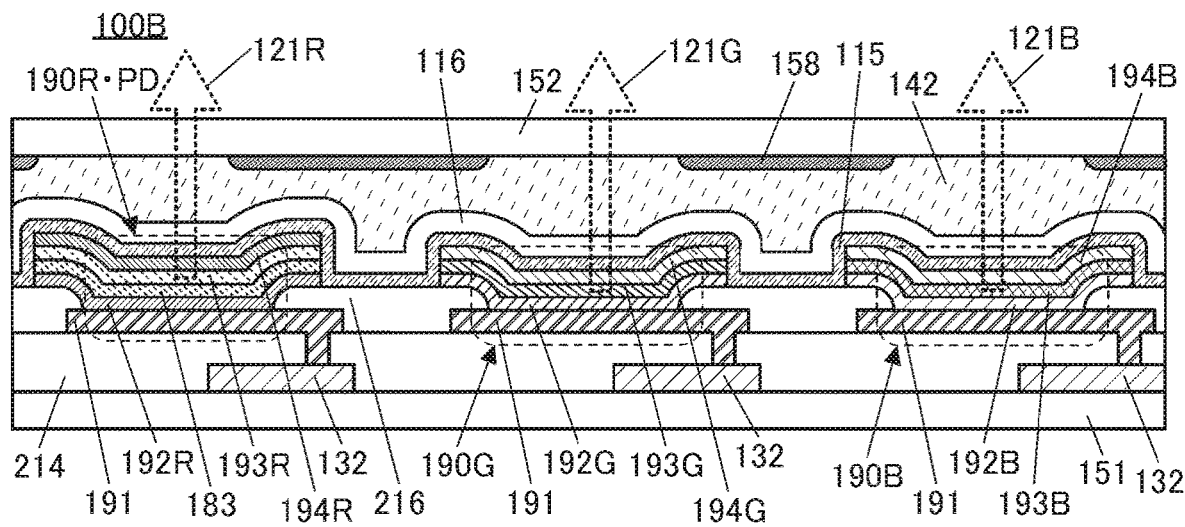
Figure 10C:
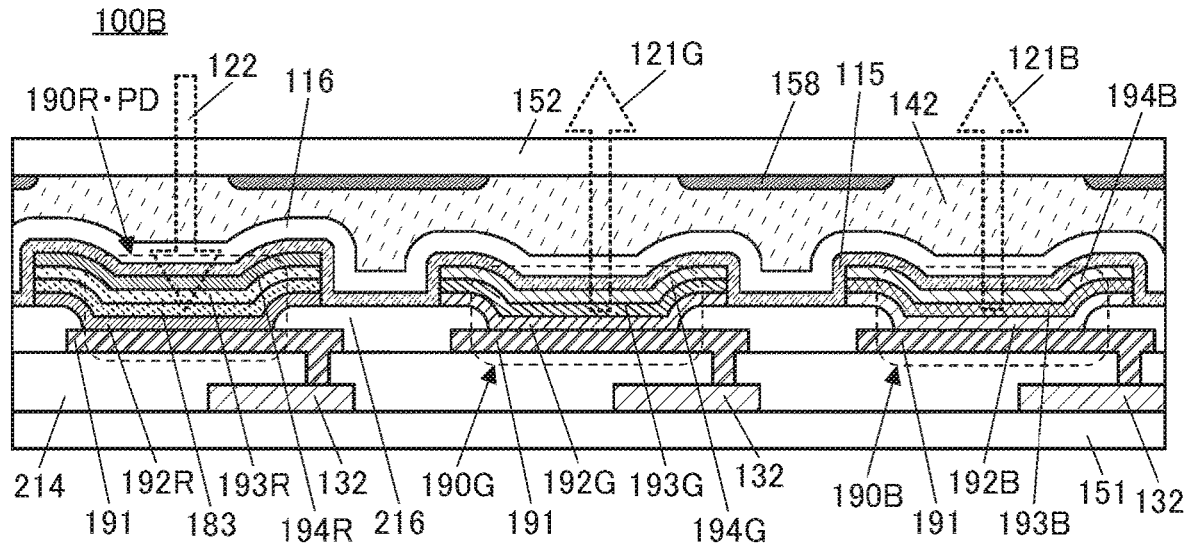

FIG. 10B and FIG. 10C illustrate cross-sectional views of a display device 100B. Note that in the description of the display device below, components similar to those of the above-mentioned display device are not described in some cases.

The display device 100B includes a light-emitting element 190B, a light-emitting element 190G, and a light-emitting and light-receiving element 190R•PD.

The light-emitting element 190B includes the pixel electrode 191, a buffer layer 192B, a light-emitting layer 193B, a buffer layer 194B, and the common electrode 115 which are stacked in this order. The light-emitting element 190B has a function of emitting blue light 121B.

The light-emitting element 190G includes the pixel electrode 191, a buffer layer 192G, a light-emitting layer 193G, a buffer layer 194G, and the common electrode 115 which are stacked in this order. The light-emitting element 190G has a function of emitting green light 121G.

The light-emitting and light-receiving element 190R•PD includes the pixel electrode 191, a buffer layer 192R, the active layer 183, a light-emitting layer 193R, a buffer layer 194R, and the common electrode 115 which are stacked in this order. The light-emitting and light-receiving element 190R•PD has a function of emitting red light 121R and a function of detecting the light 122.

FIG. 10B illustrates a case where the light-emitting and light-receiving element 190R•PD functions as a light-emitting element. FIG. 10B illustrates an example in which the light-emitting element 190B emits blue light, the light-emitting element 190G emits green light, and the light-emitting and light-receiving element 190R•PD emits red light.

FIG. 10C illustrates a case where the light-emitting and light-receiving element 190R•PD functions as a light receiving element. FIG. 10C illustrates an example in which the light-emitting and light-receiving element 190R•PD detects blue light emitted by the light-emitting element 190B and green light emitted by the light-emitting element 190G.

The display device 100B includes the light-emitting and light-receiving element 190R•PD, the light-emitting element 190G, the light-emitting element 190B, the transistor 132, and the like between a pair of substrates (the substrate 151 and a substrate 152).

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The light-emitting and light-receiving element and the light-emitting elements are preferably covered with the protective layer 116. The protective layer 116 and the substrate 152 are bonded to each other with the adhesive layer 142. The light shielding layer 158 is provided on the surface of the substrate 152 on the substrate 151 side.

[Display Device 100C]

Figure 11A:
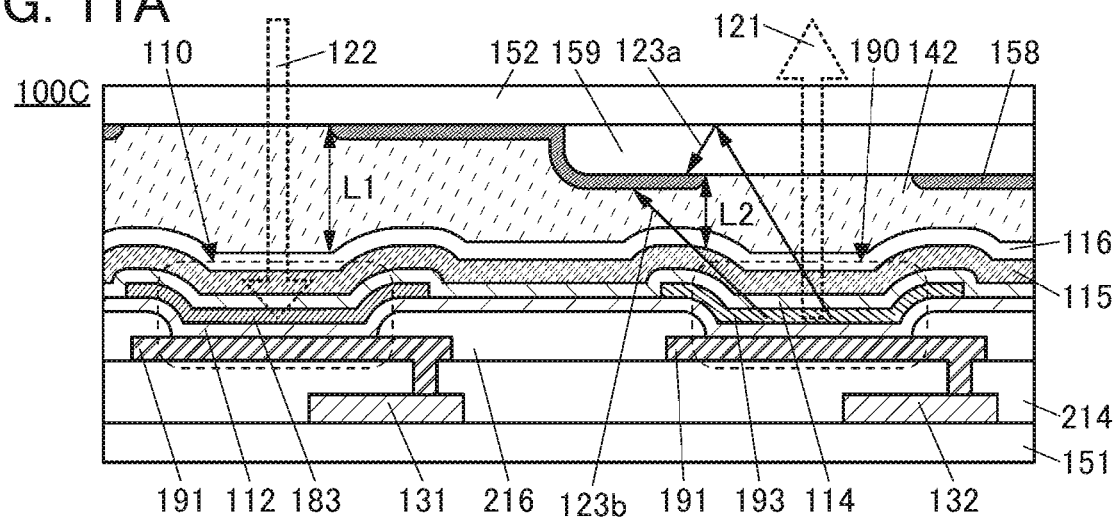
FIG. 11A is a cross-sectional view illustrating an example of a display device.

FIG. 11A illustrates a cross-sectional view of a display device 100C.

The display device 100C includes the light-receiving element 110 and the light-emitting element 190.

The light-emitting element 190 includes the pixel electrode 191, a common layer 112, the light-emitting layer 193, a common layer 114, and the common electrode 115 in this order. The common layer 112 can include one or both of a hole-injection layer and a hole-transport layer. The light-emitting layer 193 contains an organic compound. The common layer 114 can include one or both of an electron-injection layer and an electron-transport layer. The light-emitting element 190 has a function of emitting visible light. Note that the display device 100C may also include a light-emitting element having a function of emitting infrared light.

The light-receiving element 110 includes the pixel electrode 191, the common layer 112, the active layer 183, the common layer 114, and the common electrode 115 which are stacked in this order. The active layer 183 contains an organic compound. The light-receiving element 110 has a function of detecting visible light. Note that the light-receiving element 110 may also have a function of detecting infrared light.

The pixel electrode 191, the common layer 112, the active layer 183, the light-emitting layer 193, the common layer 114, and the common electrode 115 may each have a single-layer structure or a stacked-layer structure.

The pixel electrode 191 is positioned over the insulating layer 214. The two pixel electrodes 191 adjacent to each other are electrically insulated from each other by the partition 216. The pixel electrode 191 is electrically connected to the source or the drain of the transistor 132 through the opening provided in the insulating layer 214.

The common layer 112, the common layer 114, and the common electrode 115 are layers shared by the light-receiving element 110 and the light-emitting element 190. At least some of the layers constituting the light-receiving element 110 and the light-emitting element 190 preferably have common structures, in which case the number of manufacturing steps of the display device can be reduced.

The display device 100C includes the light-receiving element 110, the light-emitting element 190, the transistor 131, the transistor 132, and the like between the pair of substrates (the substrate 151 and the substrate 152).

The light-receiving element 110 and the light-emitting element 190 are preferably covered with the protective layer 116. The protective layer 116 and the substrate 152 are bonded to each other with the adhesive layer 142.

A resin layer 159 is provided on the surface of the substrate 152 on the substrate 151 side. The resin layer 159 is provided in a position overlapping with the light-emitting element 190 and is not provided in a position overlapping with the light-receiving element 110.

Figure 11B:
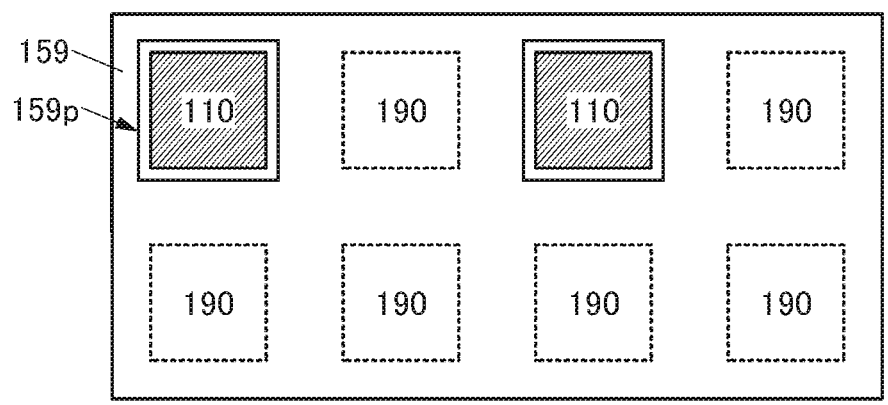
Figure 11C:
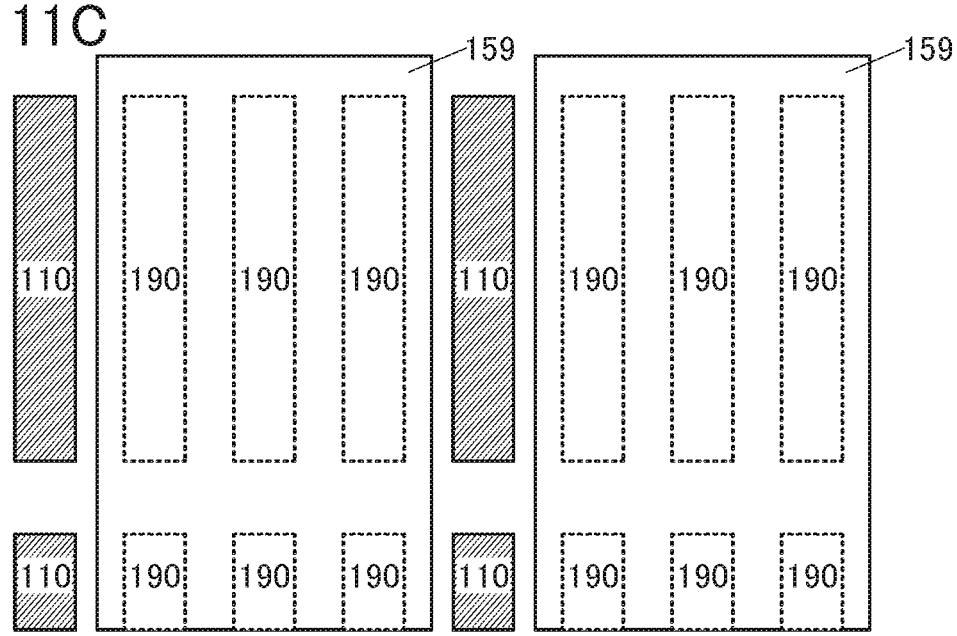

The resin layer 159 can be provided in the position overlapping with the light-emitting element 190 and have an opening 159p in the position overlapping with the light-receiving element 110, as illustrated in FIG. 11B, for example. Alternatively, as illustrated in FIG. 11C, the resin layer 159 can be provided to have an island shape in a position overlapping with the light-emitting element 190 but not in a position overlapping with the light-receiving element 110.

The light shielding layer 158 is provided on the surface of the substrate 152 on the substrate 151 side and on a surface of the resin layer 159 on the substrate 151 side. The light shielding layer 158 has openings in a position overlapping with the light-emitting element 190 and in a position overlapping with the light-receiving element 110.

Here, the light-receiving element 110 detects light that is emitted from the light-emitting element 190 and then reflected by an object. However, in some cases, light emitted from the light-emitting element 190 is reflected inside the display device 100C and enters the light-receiving element 110 without through an object. The light shielding layer 158 can absorb such stray light and thereby reduce entry of stray light into the light-receiving element 110. For example, the light shielding layer 158 can absorb stray light 123a that has passed through the resin layer 159 and has been reflected by the surface of the substrate 152 on the substrate 151 side. Moreover, the light shielding layer 158 can absorb stray light 123b before the stray light 123b reaches the resin layer 159. This can inhibit stray light from entering the light-receiving element 110. Consequently, noise can be reduced, and the sensitivity of a sensor using the light-receiving element 110 can be increased. It is particularly preferable that the light shielding layer 158 be positioned close to the light-emitting element 190, in which case stray light can be further reduced. This is preferable also in terms of improving display quality, because the light shielding layer 158 positioned close to the light-emitting element 190 can inhibit viewing angle dependence of display.

Providing the light shielding layer 158 can control the range where the light-receiving element 110 detects light. When the light shielding layer 158 is positioned apart from the light-receiving element 110, the image-capturing range is narrowed, and the image-capturing resolution can be increased.

In the case where the resin layer 159 has an opening, the light shielding layer 158 preferably covers at least part of the opening and at least part of a side surface of the resin layer 159 exposed in the opening.

In the case where the resin layer 159 is provided in an island shape, the light shielding layer 158 preferably covers at least part of a side surface of the resin layer 159.

Since the light shielding layer 158 is provided along the shape of the resin layer 159 in such a manner, the distance from the light shielding layer 158 to the light-emitting element 190 (specifically, the light-emitting region of the light-emitting element 190) is shorter than the distance from the light shielding layer 158 to the light-receiving element 110 (specifically, the light-receiving region of the light-receiving element 110). Accordingly, noise of the sensor can be reduced, the imaging resolution can be increased, and viewing angle dependence of display can be inhibited. Thus, both the display quality and imaging quality of the display device can be increased.

The resin layer 159 is a layer that transmits light emitted from the light-emitting element 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light shielding layer 158 is not limited to the resin layer and may be an inorganic insulating film or the like. As the component becomes thicker, a larger difference occurs between the distance from the light shielding layer to the light-receiving element and the distance from the light shielding layer to the light-emitting element. An organic insulating film such as a resin or the like is suitable for the component because it is easily formed to have a large thickness.

In order to compare the distance from the light shielding layer 158 to the light-receiving element 110 and the distance from the light shielding layer 158 to the light-emitting element 190, it is possible to use, for example, the shortest distance L1 from an end portion of the light shielding layer 158 on the light-receiving element 110 side to the common electrode 115 and the shortest distance L2 from an end portion of the light shielding layer 158 on the light-emitting element 190 side to the common electrode 115. With the shortest distance L2 smaller than the shortest distance L1, stray light from the light-emitting element 190 can be inhibited, and the sensitivity of the sensor using the light-receiving element 110 can be increased. Furthermore, viewing angle dependence of display can be inhibited. With the shortest distance L1 larger than the shortest distance L2, the image-capturing range of the light-receiving element 110 can be narrowed, and the image-capturing resolution can be increased.

In addition, when the adhesive layer 142 is provided such that a portion overlapping with the light-receiving element 110 is made thicker than a portion overlapping with the light-emitting element 190, a difference also can be made between the distance from the light shielding layer 158 to the light-receiving element 110 and the distance from the light shielding layer 158 to the light-emitting element 190.

A more detailed structure of the display device of one embodiment of the present invention is described below with reference to FIG. 12 to FIG. 15.

[Display Device 100D]

Figure 12:
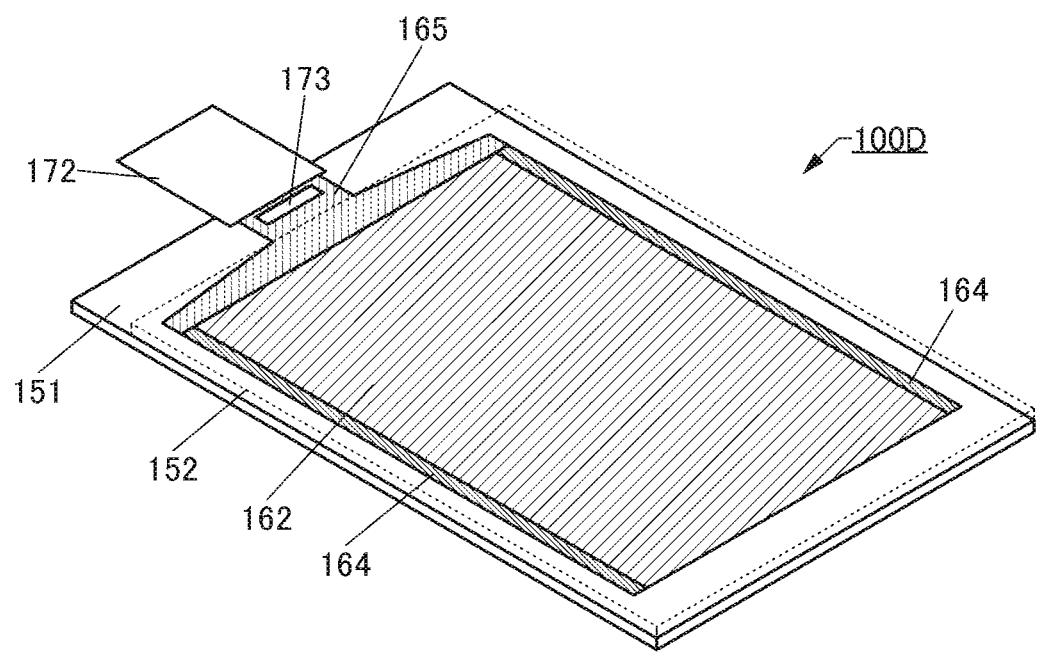
FIG. 12 is a perspective view illustrating an example of a display device.
Figure 13:
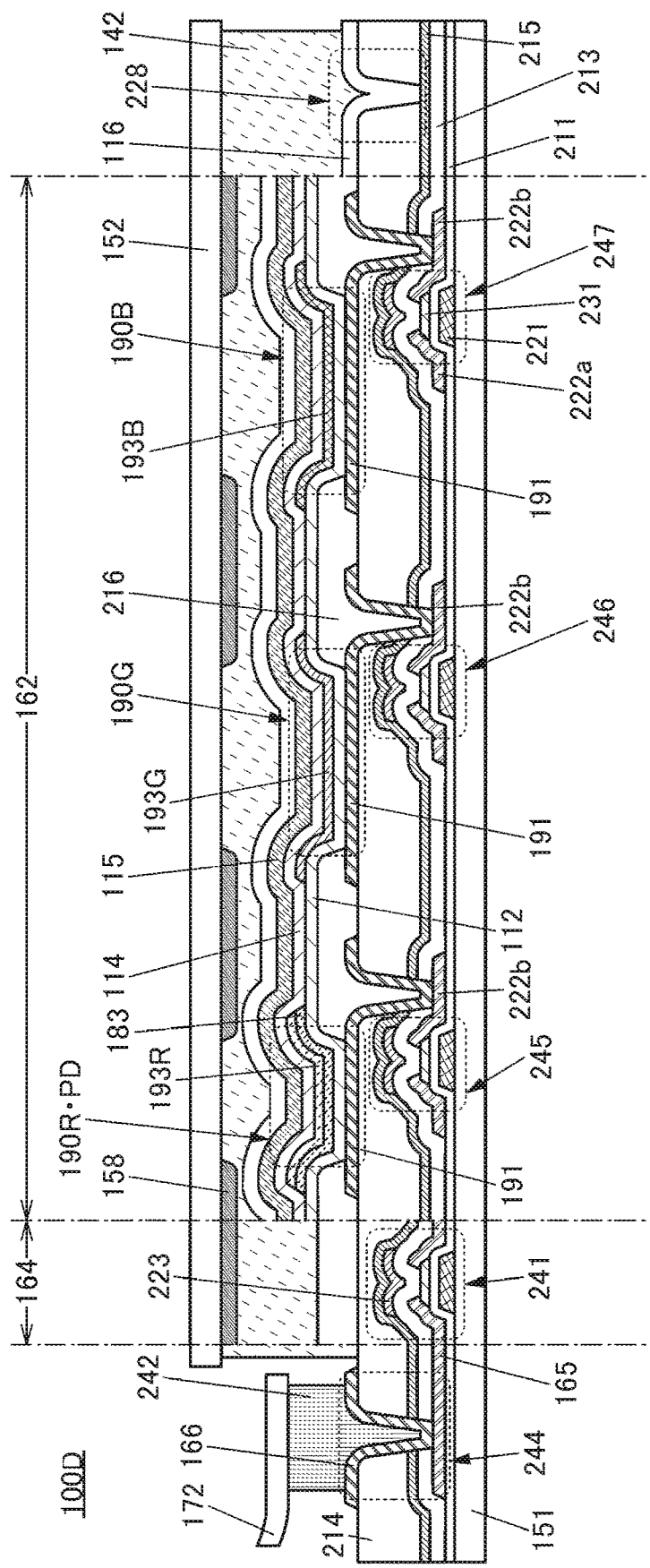
FIG. 13 is a cross-sectional view illustrating an example of a display device.

FIG. 12 illustrates a perspective view of a display device 100D, and FIG. 13 illustrates a cross-sectional view of the display device 100D.

The display device 100D has a structure in which the substrate 152 and the substrate 151 are bonded to each other. In FIG. 12, the substrate 152 is denoted by a dashed line.

The display device 100D includes a display portion 162, a circuit 164, a wiring 165, and the like. FIG. 12 illustrates an example in which an IC 173 and an FPC 172 are integrated on the display device 100D. Thus, the structure illustrated in FIG. 12 can be regarded as a display module including the display device 100D, the IC (integrated circuit), and the FPC (Flexible Printed Circuit).

As the circuit 164, for example, a scan line driver circuit can be used.

The wiring 165 has a function of supplying a signal and power to the display portion 162 and the circuit 164. The signal and power are input to the wiring 165 from the outside through the FPC 172 or from the IC 173.

FIG. 12 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display device 100D and the display module may have a structure that is not provided with an IC. The IC may be provided over the FPC by a COF method or the like.

FIG. 13 illustrates an example of cross sections of part of a region including the FPC 172, part of a region including the circuit 164, part of a region including the display portion 162, and part of a region including an end portion of the display device 100D illustrated in FIG. 12.

The display device 100D illustrated in FIG. 13 includes a transistor 241, a transistor 245, a transistor 246, a transistor 247, the light-emitting element 190B, the light-emitting element 190G, the light-emitting and light-receiving element 190R•PD, and the like between the substrate 151 and the substrate 152.

The substrate 152 and the protective layer 116 are bonded to each other with the adhesive layer 142. A solid sealing structure, a hollow sealing structure, or the like can be employed to seal the light-emitting element 190B, the light-emitting element 190G, and the light-emitting and light-receiving element 190R•PD. In FIG. 13, a space surrounded by the substrate 152, the adhesive layer 142, and the insulating layer 214 is sealed with the adhesive layer 142, and the solid sealing structure is employed.

The light-emitting element 190B has a stacked-layer structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 247 through an opening provided in the insulating layer 214. The transistor 247 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 246 through an opening provided in the insulating layer 214. The transistor 246 has a function of controlling the driving of the light-emitting element 190G.

The light-emitting and light-receiving element 190R•PD has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 245 through an opening provided in the insulating layer 214. The transistor 245 has a function of controlling the driving of the light-emitting and light-receiving element 190R•PD.

Light emitted by the light-emitting element 190B, the light-emitting element 190G, and the light-emitting and light-receiving element 190R•PD is emitted toward the substrate 152 side. Light enters the light-emitting and light-receiving element 190R•PD through the substrate 152 and the adhesive layer 142. For the substrate 152 and the adhesive layer 142, a material having a high visible-light-transmitting property is preferably used.

The pixel electrodes 191 included in the light-emitting element 190B, the light-emitting element 190G, and the light-emitting and light-receiving element 190R•PD can be formed using the same material in the same step. The common layer 112, the common layer 114, and the common electrode 115 are used in common in the light-emitting element 190B, the light-emitting element 190G, and the light-emitting and light-receiving element 190R•PD. The light-emitting and light-receiving element 190R•PD has the structure of the red-light-emitting element to which the active layer 183 is added. The light-emitting element 190B, the light-emitting element 190G, and the light-emitting and light-receiving element 190R•PD can have a common structure except for the active layer 183 and the light-emitting layer 193 of each color. Thus, the display portion 162 of the display device 100D can have a light-receiving function without a significant increase in the number of manufacturing steps.

The light shielding layer 158 is provided on the surface of the substrate 152 on the substrate 151 side. The light shielding layer 158 includes openings in positions overlapping with the light-emitting element 190B, the light-emitting element 190G, and the light-emitting and light-receiving element 190R•PD. Providing the light shielding layer 158 can control the range where the light-emitting and light-receiving element 190R•PD detects light. As described above, it is preferable to control light entering the light-emitting and light-receiving element by adjusting the position of the opening of the light shielding layer provided in a position overlapping with the light-emitting and light-receiving element 190R•PD. Furthermore, with the light shielding layer 158, light can be inhibited from directly entering the light-emitting and light-receiving element 190R•PD from the light-emitting element 190 without through an object. Hence, a sensor with less noise and high sensitivity can be obtained.

The transistor 241, the transistor 245, the transistor 246, and the transistor 247 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water and hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display device 100D. This can inhibit entry of impurities from the end portion of the display device 100D through the organic insulating film. Alternatively, the organic insulating film may be formed so that an end portion of the organic insulating film is positioned on the inner side compared to the end portion of the display device 100D, to prevent the organic insulating film from being exposed at the end portion of the display device 100D.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

By provision of the protective layer 116 that covers the light-emitting element 190B, the light-emitting element 190G, and the light-emitting and light-receiving element 190R•PD, impurities such as water can be inhibited from entering the light-emitting element 190B, the light-emitting element 190G, and the light-emitting and light-receiving element 190R•PD, leading to an increase in the reliability of the light-emitting element 190B, the light-emitting element 190G, and the light-emitting and light-receiving element 190R•PD.

In a region 228 illustrated in FIG. 13, an opening is formed in the insulating layer 214. This can inhibit entry of impurities into the display portion 162 from the outside through the insulating layer 214 even when an organic insulating film is used as the insulating layer 214. Thus, the reliability of the display device 100D can be increased.

In the region 228 in the vicinity of an end portion of the display device 100D, the insulating layer 215 and the protective layer 116 are preferably in contact with each other through the opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Thus, the reliability of the display device 100D can be increased.

The protective layer 116 may have a single-layer structure or a stacked-layer structure. For example, the protective layer 116 may have a stacked-layer structure of an organic insulating film and an inorganic insulating film. In that case, an end portion of the inorganic insulating film preferably extends beyond an end portion of the organic insulating film.

Each of the transistor 241, the transistor 245, the transistor 246, and the transistor 247 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are illustrated with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 241, the transistor 245, the transistor 246, and the transistor 247. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and any of an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 244 is provided in a region of the substrate 151 that does not overlap with the substrate 152. In the connection portion 244, the wiring 165 is electrically connected to the FPC 172 via a conductive layer 166 and a connection layer 242. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

A variety of optical members can be arranged on an outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film suppressing the attachment of stain, a hard coat film inhibiting generation of a scratch caused by the use, a shock absorbing layer, or the like may be provided on the outer surface of the substrate 152.

For each of the substrate 151 and the substrate 152, glass, quartz, ceramic, sapphire, resin, or the like can be used. When a flexible material is used for the substrate 151 and the substrate 152, the flexibility of the display device can be increased.

For the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

For the structures, materials, and the like of the light-emitting elements 190G and 190B and the light-emitting and light-receiving element 190R•PD, the above description can be referred to.

As materials that can be used for a gate, a source, and a drain of a transistor and conductive layers such as a variety of wirings and electrodes included in a display device, metals such as aluminum, titanium, chromium, nickel, copper, yttrium, zirconium, molybdenum, silver, tantalum, and tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display device, and conductive layers (conductive layers functioning as a pixel electrode or a common electrode) included in a light-emitting element and a light-receiving element (or a light-emitting and light-receiving element).

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 100E]

Figure 14:
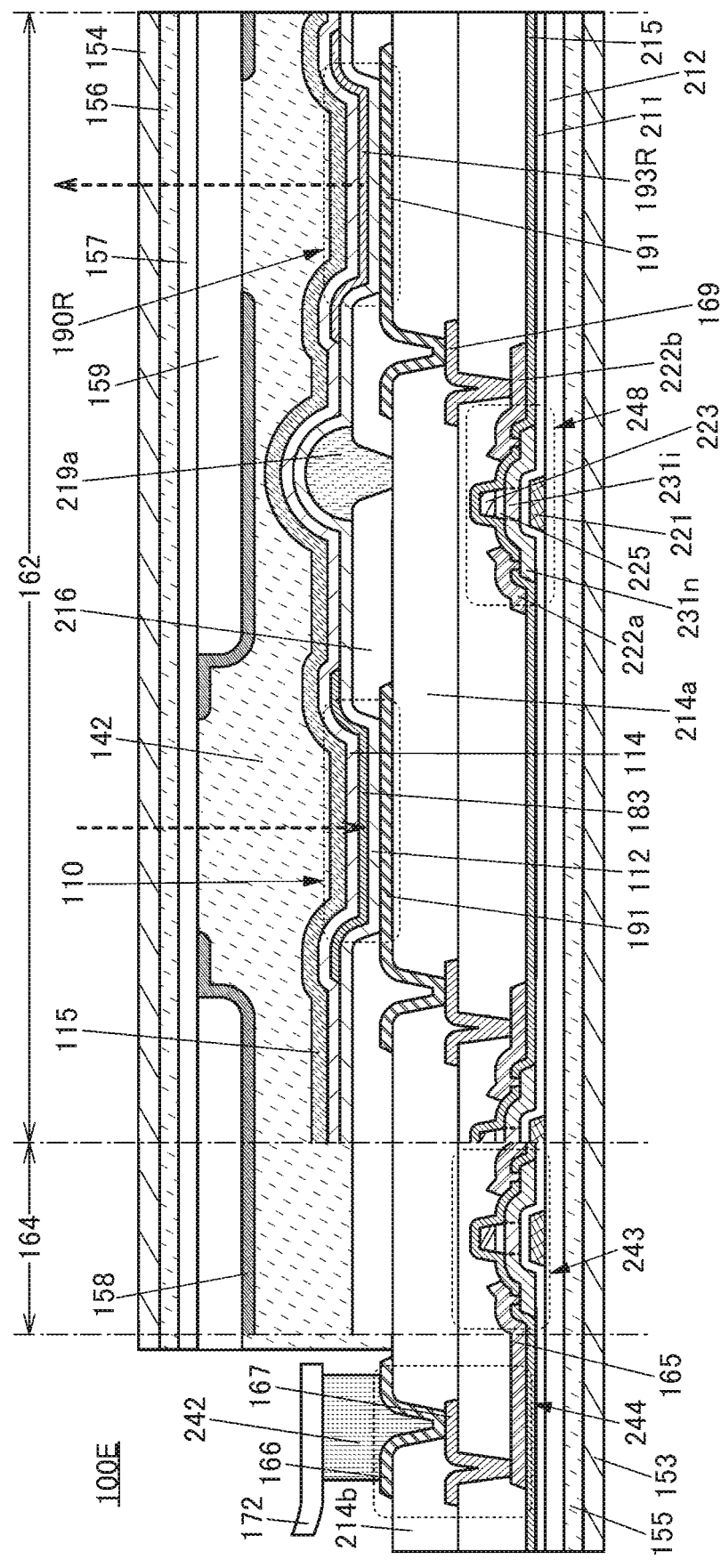
FIG. 14 is a cross-sectional view illustrating an example of a display device.

FIG. 14 and FIG. 15A illustrate cross-sectional views of a display device 100E. A perspective view of the display device 100E is similar to that of the display device 100D (FIG. 9). FIG. 14 illustrates an example of cross sections of part of a region including the FPC 172, part of the circuit 164, and part of the display portion 162 in the display device 100E. FIG. 15A illustrates an example of a cross section of part of the display portion 162 in the display device 100E. FIG. 14 specifically illustrates an example of a cross section of a region including the light-receiving element 110 and the light-emitting element 190R that emits red light in the display portion 162. FIG. 15A specifically illustrates an example of a cross section of a region including the light-emitting element 190G that emits green light and the light-emitting element 190B that emits blue light in the display portion 162.

The display device 100E illustrated in FIG. 14 and FIG. 15A includes a transistor 243, a transistor 248, a transistor 249, a transistor 240, the light-emitting element 190R, the light-emitting element 190G, the light-emitting element 190B, the light-receiving element 110, and the like between a substrate 153 and a substrate 154.

The resin layer 159 and the common electrode 115 are bonded to each other with the adhesive layer 142, and the display device 100E employs a solid sealing structure.

The substrate 153 and the insulating layer 212 are bonded to each other with an adhesive layer 155. The substrate 154 and an insulating layer 157 are bonded to each other with an adhesive layer 156.

To fabricate the display device 100E, first, a first formation substrate provided with the insulating layer 212, the transistors, the light-receiving element 110, the light-emitting elements, and the like and a second formation substrate provided with the insulating layer 157, the resin layer 159, the light shielding layer 158, and the like are bonded to each other with the adhesive layer 142. Then, the substrate 153 is bonded to a surface exposed by separation of the first formation substrate, and the substrate 154 is bonded to a surface exposed by separation of the second formation substrate, whereby the components formed over the first formation substrate and the second formation substrate are transferred to the substrate 153 and the substrate 154. The substrate 153 and the substrate 154 preferably have flexibility. Accordingly, the flexibility of the display device 100E can be increased.

The inorganic insulating film that can be used as the insulating layer 211, the insulating layer 213, and the insulating layer 215 can be used as the insulating layer 212 and the insulating layer 157.

The light-emitting element 190R has a stacked-layer structure in which the pixel electrode 191, the common layer 112, the light-emitting layer 193R, the common layer 114, and the common electrode 115 are stacked in this order from an insulating layer 214b side. The pixel electrode 191 is connected to a conductive layer 169 through an opening provided in the insulating layer 214b. The conductive layer 169 is connected to the conductive layer 222b included in the transistor 248 through an opening provided in an insulating layer 214a. The conductive layer 222b is connected to a low-resistance region 231n through an opening provided in the insulating layer 215. That is, the pixel electrode 191 is electrically connected to the transistor 248. The transistor 248 has a function of controlling the driving of the light-emitting element 190R.

Similarly, the light-emitting element 190G has a stacked-layer structure in which the pixel electrode 191, the common layer 112, the light-emitting layer 193G, the common layer 114, and the common electrode 115 are stacked in this order from the insulating layer 214b side. The pixel electrode 191 is electrically connected to the low-resistance region 231n of the transistor 249 through the conductive layer 169 and the conductive layer 222b of the transistor 249. That is, the pixel electrode 191 is electrically connected to the transistor 249. The transistor 249 has a function of controlling the driving of the light-emitting element 190G.

In addition, the light-emitting element 190B has a stacked-layer structure in which the pixel electrode 191, the common layer 112, the light-emitting layer 193B, the common layer 114, and the common electrode 115 are stacked in this order from the insulating layer 214b side. The pixel electrode 191 is electrically connected to the low-resistance region 231n of the transistor 240 through the conductive layer 169 and the conductive layer 222b of the transistor 240. That is, the pixel electrode 191 is electrically connected to the transistor 240. The transistor 240 has a function of controlling the driving of the light-emitting element 190B.

The light-receiving element 110 has a stacked-layer structure in which the pixel electrode 191, the common layer 112, the active layer 183, the common layer 114, and the common electrode 115 are stacked in this order from the insulating layer 214b side.

The end portion of the pixel electrode 191 is covered with the partition 216. The pixel electrode 191 contains a material that reflects visible light, and the common electrode 115 contains a material that transmits visible light.

Light emitted by the light-emitting elements 190R, 190G, and 190B is emitted toward the substrate 154 side. Light enters the light-receiving element 110 through the substrate 154 and the adhesive layer 142. For the substrate 154, a material having a high visible-light-transmitting property is preferably used.

The pixel electrodes 191 can be formed using the same material in the same step. The common layer 112, the common layer 114, and the common electrode 115 are used in common in the light-receiving element 110 and the light-emitting elements 190R, 190G, and 190B. The light-receiving element 110 and the light-emitting element of each color can have a common structure except for the active layer 183 and the light-emitting layer. Thus, the light-receiving element 110 can be incorporated into the display device 100E without a significant increase in the number of manufacturing steps.

The resin layer 159 and the light shielding layer 158 are provided on a surface of the insulating layer 157 on the substrate 153 side. The resin layer 159 is provided in positions overlapping with the light-emitting elements 190R, 190G, and 190B and is not provided in a position overlapping with the light-receiving element 110. The light shielding layer 158 is provided to cover the surface of the insulating layer 157 on the substrate 153 side, a side surface of the resin layer 159, and a surface of the resin layer 159 on the substrate 153 side. The light shielding layer 158 has openings in a position overlapping with the light-receiving element 110 and in positions overlapping with the light-emitting elements 190R, 190G, and 190B. Providing the light shielding layer 158 can control the range where the light-receiving element 110 detects light. Furthermore, with the light shielding layer 158, light can be inhibited from directly entering the light-receiving element 110 from the light-emitting elements 190R, 190G, and 190B without through an object. Hence, a sensor with less noise and high sensitivity can be obtained. Providing the resin layer 159 allows the distance from the light shielding layer 158 to the light-emitting element of each color to be shorter than the distance from the light shielding layer 158 to the light-receiving element 110. Accordingly, viewing angle dependence of display can be inhibited while noise of the sensor is reduced. Thus, both the display quality and imaging quality can be increased.

As illustrated in FIG. 14, the partition 216 has an opening between the light-receiving element 110 and the light-emitting element 190R. A light shielding layer 219a is provided to fill the opening. The light shielding layer 219a is positioned between the light-receiving element 110 and the light-emitting element 190R. The light shielding layer 219a absorbs light emitted from the light-emitting element 190R. This can inhibit stray light from entering the light-receiving element 110.

A spacer 219b is provided over the partition 216 and positioned between the light-emitting element 190G and the light-emitting element 190B. A top surface of the spacer 219b is preferably closer to the light shielding layer 158 than a top surface of the light shielding layer 219a is. For example, the sum of the height (thickness) of the partition 216 and the height (thickness) of the spacer 219b is preferably larger than the height (thickness) of the light shielding layer 219a. Thus, filling with the adhesive layer 142 can be facilitated. As illustrated in FIG. 15A, the light shielding layer 158 may be in contact with the common electrode 115 (or the protective layer) in a portion where the spacer 219b and the light shielding layer 158 overlap with each other.

The connection portion 244 is provided in a region of the substrate 153 that does not overlap with the substrate 154. In the connection portion 244, the wiring 165 is electrically connected to the FPC 172 through a conductive layer 167, the conductive layer 166, and the connection layer 242. The conductive layer 167 can be obtained by processing the same conductive film as the conductive layer 169. On the top surface of the connection portion 244, the conductive layer 166 obtained by processing the same conductive film as the pixel electrode 191 is exposed. Thus, the connection portion 244 and the FPC 172 can be electrically connected to each other through the connection layer 242.

Each of the transistor 243, the transistor 248, the transistor 249, and the transistor 240 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

In FIG. 14 and FIG. 15A, the insulating layer 225 overlaps with the channel formation region 231i of the semiconductor layer 231 and does not overlap with the low-resistance regions 231n. The structure illustrated in FIG. 14 and FIG. 15A can be formed by processing the insulating layer 225 using the conductive layer 223 as a mask, for example. In FIG. 14 and FIG. 15A, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer that covers the transistor may be provided over the conductive layer 222a and the conductive layer 222b.

Meanwhile, a transistor 252 illustrated in FIG. 15B is an example in which the insulating layer 225 covers a top surface and a side surface of the semiconductor layer. The conductive layer 222a and the conductive layer 222b are connected to the corresponding low-resistance regions 231n through openings provided in the insulating layer 225 and the insulating layer 215.

As described above, in the display device of one embodiment of the present invention, the distances between the two light-emitting elements and the light-receiving element (or the light-emitting and light-receiving element) differ from each other, and the distances from the two light-emitting elements to the opening of the light shielding layer overlapping with the light-receiving element (or the light-emitting and light-receiving element) differ from each other. With this structure, the light-receiving element or the light-emitting and light-receiving element can receive light coming from one of the two light-emitting elements more than light coming from the other. Accordingly, much light coming from the light-emitting element used as a light source can be made to enter the light-receiving element or the light-emitting and light-receiving element in the display device of one embodiment of the present invention, for example.

[Example of Pixel Circuit]

The display device of one embodiment of the present invention includes, in the display portion, first pixel circuits each including a light-receiving element and second pixel circuits each including a light-emitting element. The first pixel circuits and the second pixel circuits are each arranged in a matrix.

Figure 16A:
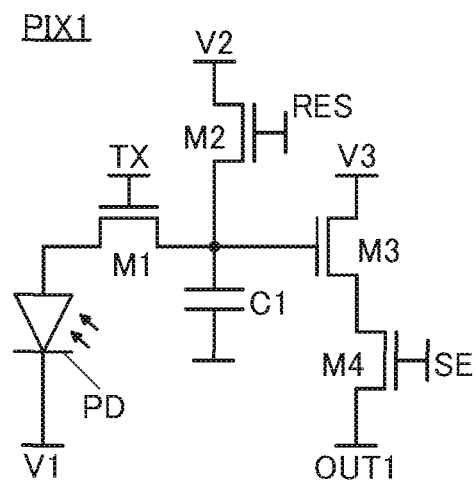
FIG. 16A and FIG. 16B are circuit diagrams illustrating examples of a pixel circuit.
Figure 16B:
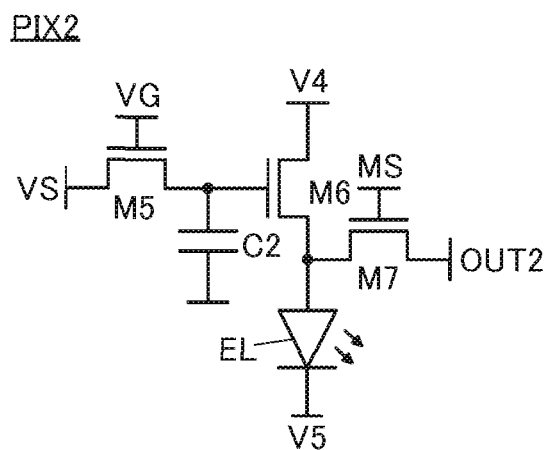

FIG. 16A illustrates an example of the first pixel circuit including a light-receiving element, and FIG. 16B illustrates an example of the second pixel circuit including a light-emitting element.

A pixel circuit PIX1 illustrated in FIG. 16A includes a light-receiving element PD, a transistor M1, a transistor M2, a transistor M3, a transistor M4, and a capacitor C1. Here, an example in which a photodiode is used as the light-receiving element PD is illustrated.

A cathode of the light-receiving element PD is electrically connected to a wiring V1, and an anode thereof is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to the wiring V1, the wiring V2, and the wiring V3. When the light-receiving element PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

A pixel circuit PIX2 illustrated in FIG. 16B includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain of the transistor M5 is electrically connected to a wiring VS, and the other of the source and the drain of the transistor M5 is electrically connected to one electrode of the capacitor C2 and a gate of the transistor M6. One of a source and a drain of the transistor M6 is electrically connected to a wiring V4, and the other thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5.

A constant potential is supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL, in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

The wiring V1, to which the cathode of the light-receiving element PD is electrically connected, and the wiring V5, to which the cathode of the light-emitting element EL is electrically connected, can be provided in the same layer and have the same level of potential.

In the display device of one embodiment of the present invention, it is preferable to use transistors including a metal oxide (also referred to as an oxide semiconductor) in their semiconductor layers where channels are formed (such transistors are also referred to as OS transistors below) as all the transistors included in the first pixel circuit PIX1 and the second pixel circuit PIX2. An OS transistor has an extremely low off-state current and enables charge stored in a capacitor that is series-connected to the transistor to be retained for along time. Furthermore, power consumption of the display device can be reduced with an OS transistor.

Alternatively, in the display device of one embodiment of the present invention, it is preferable to use transistors including silicon in their semiconductor layers where channels are formed (such transistors are also referred to as Si transistors below) as all the transistors included in the pixel circuit PIX1 and the pixel circuit PIX2. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display device can be simplified, and costs of parts and mounting costs can be reduced.

In the display device of one embodiment of the present invention, two kinds of transistors are preferably used in the pixel circuit PIX1. Specifically, the pixel circuit PIX1 preferably includes an OS transistor and an LTPS transistor. Changing the material of the semiconductor layer depending on the desired function of the transistor can increase the quality of the pixel circuit PIX1 and the accuracy of sensing and image capturing. In that case, in the pixel circuit PIX2, one or both of an OS transistor and an LTPS transistor may be used.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display device can be simplified, and costs of parts and mounting costs can be reduced.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use OS transistors as the transistor M1, the transistor M2, and the transistor M5 each of which is connected in series with the capacitor C1 or the capacitor C2.

A Si transistor is preferably used as the transistor M3. This enables high-speed reading operation of imaging data.

Note that the display device which includes, in the display portion, the first pixel circuits each including a light-receiving element and the second pixel circuits each including a light-emitting element can be driven in any of an image display mode, an image capture mode, and a mode of simultaneously performing image display and image capturing. In the image display mode, a full-color image can be displayed using the light-emitting element, for example. In the image capture mode, an image for image capturing (e.g., a green monochromatic image or a blue monochromatic image) can be displayed using the light-emitting element and image capturing can be performed using the light-receiving element, for example. Fingerprint authentication can be performed in the image capture mode, for example. In the mode of simultaneously performing image display and image capturing, an image for image capturing can be displayed using the light-emitting element and image capturing can be performed using the light-receiving element in some pixels, and a full-color image can be displayed using the light-emitting element in the other pixels, for example.

Although the transistors are illustrated as n-channel transistors in FIG. 16A and FIG. 16B, p-channel transistors can alternatively be used. The transistors are not limited to single-gate transistors and may further include a back gate.

One or more layers including one or both of the transistor and the capacitor are preferably provided to overlap with the light-receiving element PD or the light-emitting element EL. Thus, the effective area of each pixel circuit can be reduced, and a high-definition display portion can be achieved.

This embodiment can be combined with the other embodiments as appropriate.

Embodiment 3

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In-Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In-Ga—Zn oxide are denoted by [In], [Ga], and [Zn], respectively. For example, the first region in the CAC-OS in the In-Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In-Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In-Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 4

In this embodiment, electronic devices of embodiments of the present invention are described with reference to FIG. 17 to FIG. 19.

An electronic device of one embodiment of the present invention can perform image capturing or detect a touch operation in a display portion. Thus, the electronic device can have improved functionality and convenience, for example.

Examples of the electronic devices of one embodiment of the present invention include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of one embodiment of the present invention can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 17A:
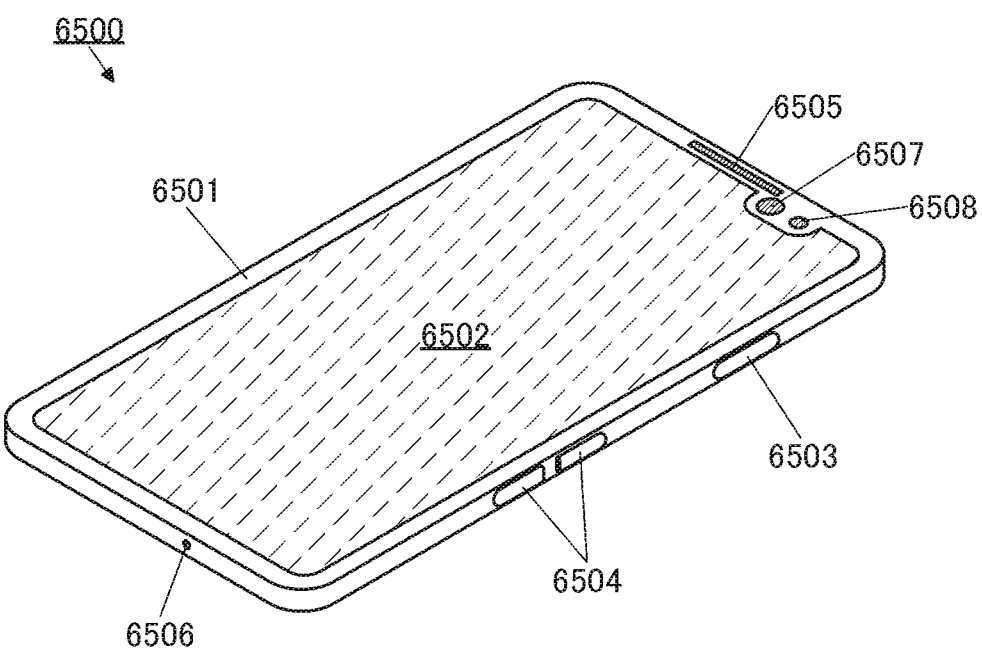
FIG. 17A and FIG. 17B are diagrams illustrating an example of an electronic device.

An electronic device 6500 illustrated in FIG. 17A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device described in Embodiment 2 can be used in the display portion 6502.

Figure 17B:
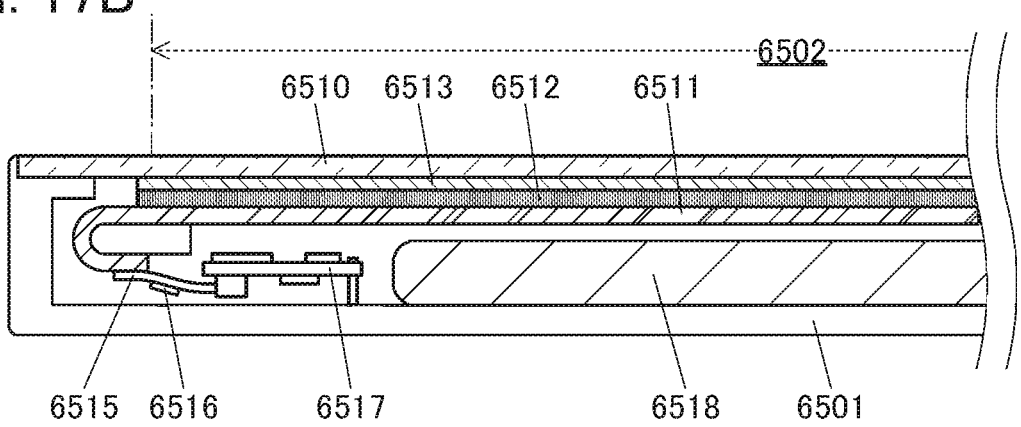

FIG. 17B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Using the display device described in Embodiment 2 as the display panel 6511 allows image capturing on the display portion 6502. For example, an image of a fingerprint is captured by the display panel 6511; thus, fingerprint authentication can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 18A:
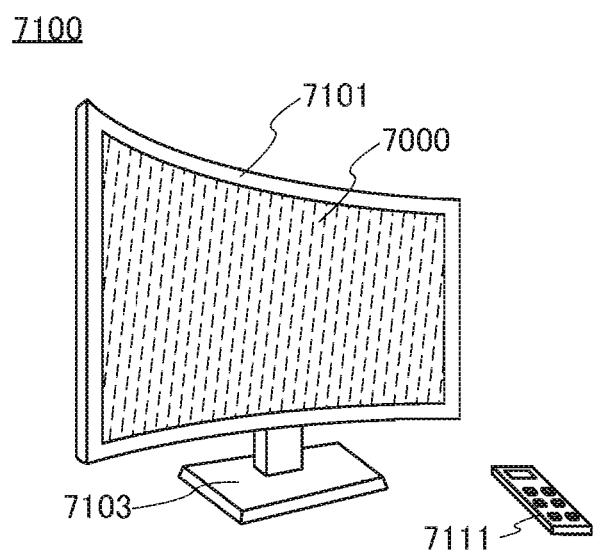
FIG. 18A to FIG. 18D are diagrams illustrating examples of electronic devices.

FIG. 18A illustrates an example of a television device. In a television device 7100, a display portion 7000 is incorporated in a housing 7101. Here, a structure in which the housing 7101 is supported by a stand 7103 is illustrated.

The display device described in Embodiment 2 can be used in the display portion 7000.

Operation of the television device 7100 illustrated in FIG. 18A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 18B:
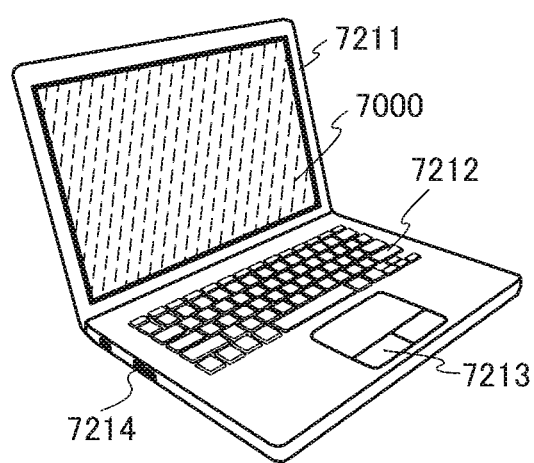

FIG. 18B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device described in Embodiment 2 can be used in the display portion 7000.

Figure 18C:
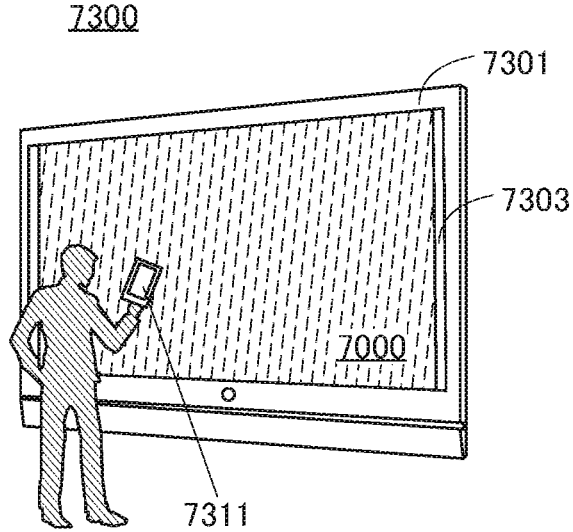
Figure 18D:
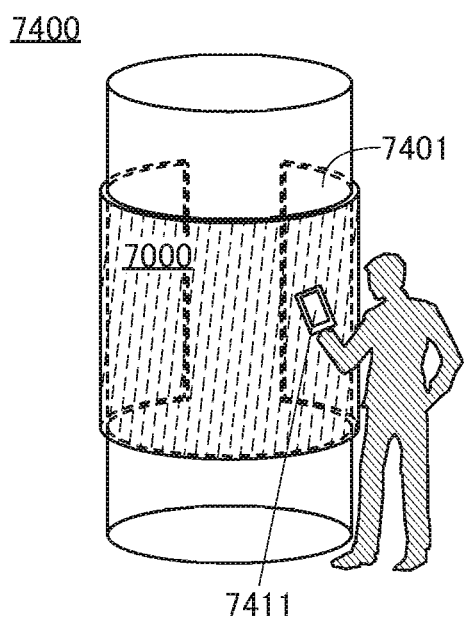

FIG. 18C and FIG. 18D illustrate examples of digital signage.

Digital signage 7300 illustrated in FIG. 18C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18D is digital signage 7400 attached to a cylindrical pillar 7401. The digital signage 7400 includes the display portion 7000 provided along a curved surface of the pillar 7401.

The display device described in Embodiment 2 can be used for the display portion 7000 in FIG. 18C and FIG. 18D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 18C and FIG. 18D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIG. 19A to FIG. 19F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 19A to FIG. 19F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 19A to FIG. 19F are described below.

Figure 19A:
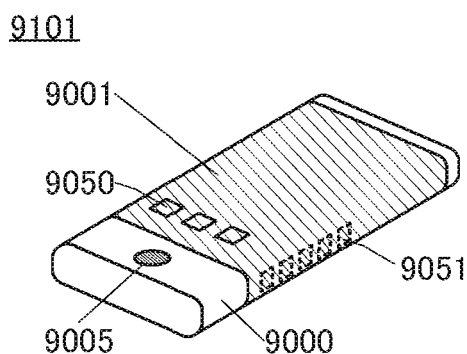
FIG. 19A to FIG. 19F are drawings illustrating examples of electronic devices.

FIG. 19A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 19A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 19B:
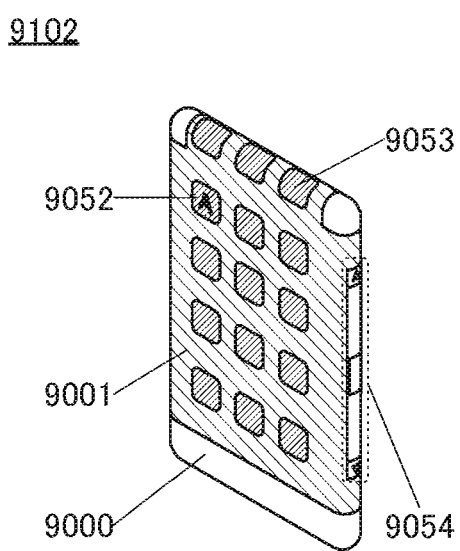

FIG. 19B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 19C:
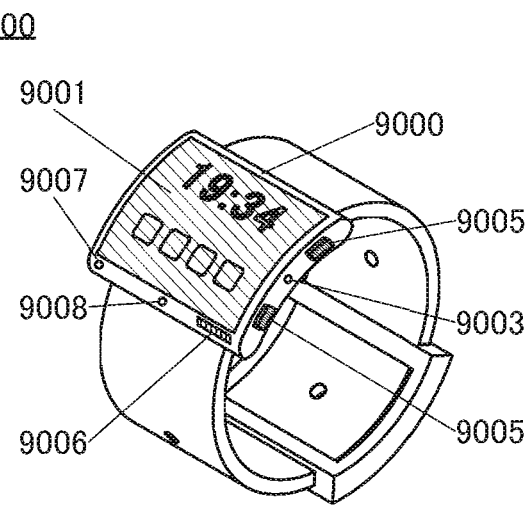

FIG. 19C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables handsfree calling. With the connection terminal 9006, the portable information terminal 9200 can perform mutual data transmission with another information terminal and charging. Note that the charging operation may be performed by wireless power feeding.

Figure 19D:
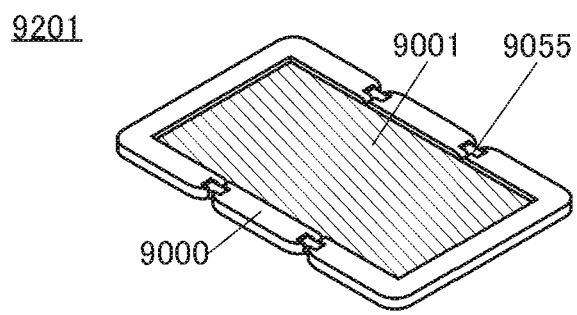
Figure 19E:
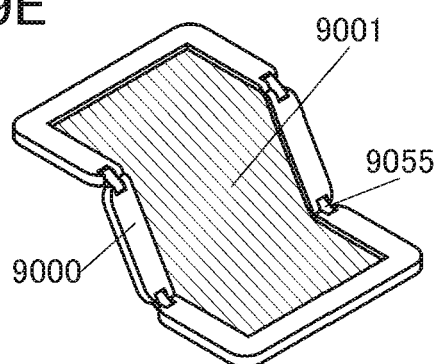
Figure 19F:
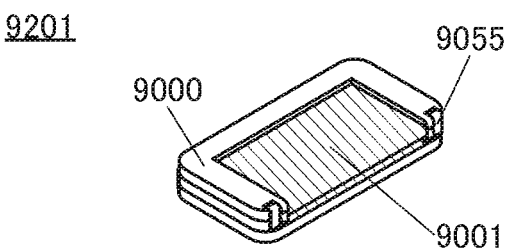

FIG. 19D to FIG. 19F are perspective views illustrating a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments as appropriate.

REFERENCE NUMERALS

C1: capacitor, C2: capacitor, L1: shortest distance, L2: shortest distance, M1: transistor, M2: transistor, M3: transistor, M4: transistor, M5: transistor, M6: transistor, M7: transistor, OUT1: wiring, OUT2: wiring, PIX1: pixel circuit, PIX2: pixel circuit, V1: wiring, V2: wiring, V3: wiring, V4: wiring, V5: wiring, 10: device, 11: control portion, 12: display portion, 13: memory portion, 20: display portion, 21: detection portion, 22: finger, 22A: contact region, 23: captured image, 24: contact area, 25: captured image, 26: captured image, 27: captured image, 28: captured image, 29: captured image, 100A: display device, 100B: display device, 100C: display device, 100D: display device, 100E: display device, 110: light-receiving element, 112: common layer, 114: common layer, 115: common electrode, 116: protective layer, 121: light emission, 121B: light, 121G: light, 121R: light, 122: light, 123: light, 123a: stray light, 123b: stray light, 124: reflected light, 131: transistor, 132: transistor, 142: adhesive layer, 151: substrate, 152: substrate, 153: substrate, 154: substrate, 155: adhesive layer, 156: adhesive layer, 157: insulating layer, 158: light shielding layer, 159: resin layer, 159p: opening, 162: display portion, 164: circuit, 165: wiring, 166: conductive layer, 167: conductive layer, 169: conductive layer, 172: FPC, 173: IC, 182: buffer layer, 183: active layer, 184: buffer layer, 190: light-emitting element, 190B: light-emitting element, 190G: light-emitting element, 190R•PD: light-emitting and light-receiving element, 190R: light-emitting element, 191: pixel electrode, 192: buffer layer, 192B: buffer layer, 192G: buffer layer, 192R: buffer layer, 193: light-emitting layer, 193B: light-emitting layer, 193G: light-emitting layer, 193R: light-emitting layer, 194: buffer layer, 194B: buffer layer, 194G: buffer layer, 194R: buffer layer, 200A: display device, 200B: display device, 201: substrate, 202: finger, 203: layer including a light-emitting element, 204: layer including a light-emitting and light-receiving element, 205: functional layer, 207: layer including a light-emitting element, 208: stylus, 209: substrate, 211: insulating layer, 212: insulating layer, 213: insulating layer, 214: insulating layer, 214a: insulating layer, 214b: insulating layer, 215: insulating layer, 216: partition, 219a: light shielding layer, 219b: spacer, 221: conductive layer, 222a: conductive layer, 222b: conductive layer, 223: conductive layer, 225: insulating layer, 228: region, 231: semiconductor layer, 231i: channel formation region, 231n: low-resistance region, 240: transistor, 241: transistor, 242: connection layer, 243: transistor, 244: connection portion, 245: transistor, 246: transistor, 247: transistor, 248: transistor, 249: transistor, 252: transistor, 261: contact portion, 262: fingerprint, 263: image-capturing range, 266: path, 270B: light-emitting element, 270G: light-emitting element, 270PD: light-receiving element, 270R•PD: light-emitting and light-receiving element, 270R: light-emitting element, 271: pixel electrode, 273: active layer, 275: common electrode, 280A: display device, 280B: display device, 280C: display device, 281: hole-injection layer, 282: hole-transport layer, 283: light-emitting layer, 283B: light-emitting layer, 283G: light-emitting layer, 283R: light-emitting layer, 284: electron-transport layer, 285: electron-injection layer, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

What is claimed is:

1. A recording medium storing a program for causing an electronic device to execute a process, comprising:
   taking a first image of a detection object touching a screen of the electronic device in a first period;
   taking a second image of the detection object touching the screen in a second period;
   obtaining a first contact area measurement of the detection object touching the screen from the first image;
   obtaining a second contact area measurement of the detection object touching the screen from the second image;
   calculating a difference between sizes of the first contact area and the second contact area;
   judging whether the difference is larger than a reference or not,
   executing a first process when the difference is larger than the reference; and
   executing a second process when the difference is smaller than or equal to the reference,
   wherein the detection object continues to touch the screen in a period between the first period and the second period.

2. An electronic device comprising:
   the recording medium according to claim 1; and
   a display portion including the screen, the display portion having flexibility.

3. An electronic device comprising:
   the recording medium according to claim 1; and
   a detection portion configured to detect a touch operation of the detection object on the screen before the first period.

* * * * *